(12) United States Patent
Salem et al.

(10) Patent No.: US 10,224,944 B2
(45) Date of Patent: Mar. 5, 2019

(54) SUCCESSIVE APPROXIMATION DIGITAL VOLTAGE REGULATION METHODS, DEVICES AND SYSTEMS

(71) Applicant: The Regents of the University of California, Oakland, CA (US)

(72) Inventors: Loai Galal Bahgat Salem, La Jolla, CA (US); Patrick Mercier, San Diego, CA (US)

(73) Assignee: The Regents of the University of California, Oakland, CA (US)

(*) Notice: Subject to any disclaimer, the term of this patent is extended or adjusted under 35 U.S.C. 154(b) by 0 days.

(21) Appl. No.: 15/888,661

(22) Filed: Feb. 5, 2018

(65) Prior Publication Data

US 2018/0226981 A1 Aug. 9, 2018

Related U.S. Application Data

(60) Provisional application No. 62/454,221, filed on Feb. 3, 2017.

(51) Int. Cl.
*H03M 1/22* (2006.01)
*H03M 1/06* (2006.01)
(Continued)

(52) U.S. Cl.
CPC ............ *H03M 1/0617* (2013.01); *G05F 1/59* (2013.01); *H03M 1/462* (2013.01); *H03M 1/808* (2013.01)

(58) Field of Classification Search
CPC .... H03M 1/0617; H03M 1/462; H03M 1/808; H03M 1/30; H03M 1/32; H03M 7/00; G05F 1/59

(Continued)

(56) References Cited

U.S. PATENT DOCUMENTS

| 7,239,116 B2 * | 7/2007 | Tang | H02M 3/157 323/266 |
| 7,554,310 B2 * | 6/2009 | Chapuis | H02M 3/157 323/282 |

(Continued)

OTHER PUBLICATIONS

Amit Agarwal et al., "A 320mV-to-1.2V On-Die Fine-Grained Reconfigurable Fabric for DSP/Media Accelerators in 32nm CMOS", IEEE International Solid-State Circuits Conference, Session 18.2, 2010.

(Continued)

*Primary Examiner* — Jean B Jeanglaude
(74) *Attorney, Agent, or Firm* — Greer, Burns & Crain, Ltd.; Steven P. Fallon

(57) ABSTRACT

A low power voltage regulator includes a weighted transistor array having a plurality of transistor switches with a total conductance of G, corresponding to bits from a MSB to LSB. A transistor switch corresponding to the MSB has a conductance of G/2 and remaining bits have a consecutive descending conductance of $G/2^N$ to the LSB, and search time takes a low number of cycles by starting with the MSB. A redundant LSB transistor switch has the same $G/2^N$ conductance of the LSB. The redundant LSB is used to correct steady-state errors, and a proportional derivative controller compensates output voltage. The compensation in a method eliminates an output pole of the voltage regulator to provide a stable voltage regulator operation irrespective of load current, load capacitance, or sampling frequency. Voltage can be regulated via the additional LSB below the resolution limit via pulse width modulation.

10 Claims, 20 Drawing Sheets

(51) Int. Cl.
  *G05F 1/59* (2006.01)
  *H03M 1/46* (2006.01)
  *H03M 1/80* (2006.01)
(58) Field of Classification Search
  USPC .............................................. 341/12, 50, 51
  See application file for complete search history.

(56) References Cited

U.S. PATENT DOCUMENTS

| | | | | |
|---|---|---|---|---|
| 7,952,337 | B2* | 5/2011 | Gurcan | H02M 3/156 323/282 |
| 8,754,622 | B2* | 6/2014 | Dobkin | H02M 3/156 323/282 |
| 8,963,519 | B2* | 2/2015 | Zambetti | H02M 3/1584 323/271 |
| 9,110,480 | B2* | 8/2015 | Babazadeh | G05F 3/02 |
| 9,136,760 | B2* | 9/2015 | Wismar | H02M 3/157 |
| 2002/0144163 | A1* | 10/2002 | Goodfellow | H02J 1/102 713/300 |
| 2006/0132110 | A1* | 6/2006 | Tang | H02M 3/157 323/282 |
| 2007/0182391 | A1* | 8/2007 | Chapuis | H02M 3/157 323/282 |
| 2014/0002042 | A1* | 1/2014 | Wismar | H02M 3/157 323/282 |
| 2015/0067991 | A1* | 3/2015 | Dodson | A01K 1/035 24/303 |

OTHER PUBLICATIONS

Mohammad Al-Shyoukh et al., "A Transient-Enhanced Low-Quiescent Current Low-Dropout Regulator With Buffer Impedance Attenuation", IEEE Journal of Solid-State Circuits, vol. 42, No. 8, pp. 1732-1742, Aug. 2007.
John F. Bulzacchelli et al., "Dual-Loop System of Distributed Microregulators With High DC Accuracy, Load Response Time Below 500 ps, and 85-mV Dropout Voltage", IEEE Journal of Solid-State Circuits, vol. 47, No. 4, pp. 863-874, Apr. 2012.
Benton H. Calhoun and Anantha P. Chandrakasan, "Ultra-Dynamic Voltage Scaling (UDVS) Using Sub-Threshold Operation and Local Voltage Dithering", IEEE Journal of Solid-State Circuits, vol. 41, No. 1, pp. 238-245, Jan. 2006.
Mohamed El-Nozahi et al., High PSR Low Drop-Out Regulator With Feed-Forward Ripple Cancellation Technique, IEEE Journal of Solid-State Circuits, vol. 45, No. 3, pp. 565-577, Mar. 2010.
Matthew Fojtik et al., "A Millimeter-Scale Energy-Autonomous Sensor System With Stacked Battery and Solar Cells", IEEE Journal of Solid-State Circuits, vol. 48, No. 3, pp. 801-813, Mar. 2013.
Samantak Gangopadhyay et al., "A 32 nm Embedded, Fully-Digital, Phase-Locked Low Dropout Regulator for Fine Grained Power Management in Digital Circuits", IEEE Journal of Solid-State Circuits, vol. 49, No. 11, pp. 2684-2693, Nov. 2014.
Samantak Gangopadhyay et al., "Modeling and Analysis of Digital Linear Dropout Regulators with Adaptive Control for High Efficiency under Wide Dynamic Range Digital Loads", Proc. Design, Autom. Test Eur. Conf. Exhibit, pp. 1-6, Mar. 2014.
Jianping Guo and Ka Nang Leung, "A 6-uW Chip-Area-Efficient Output-Capacitorless LDO in 90-nm CMOS Technology", IEEE Journal of Solid-State Circuits, vol. 45, No. 9, pp. 1896-1905, Sep. 2010.
Peter Hazucha et al., "Area-Efficient Linear Regulator With Ultra-Fast Load Regulation", IEEE Journal of Solid-State Circuits, vol. 40, No. 4, pp. 933-940, Apr. 2005.
Peter Hazucha et al., "High Voltage Tolerant Linear Regulator With Fast Digital Control for Biasing of Integrated DC-DC Converters", IEEE Journal of Solid-State Circuits, vol. 42, No. 1, pp. 66-73, Jan. 2007.

Marco Ho et al., "A Low-Power Fast-Transient 90-nm Low-Dropout Regulator With Multiple Small-Gain Stages", IEEE Journal of Solid-State Circuits, vol. 45, No. 11, pp. 2466-2475, Nov. 2010.
Mo Huang et al., "An Output-Capacitor-Free Analog-Assisted Digital Low-Dropout Regulator with Tri-Loop Control", Proc. 2017 IEEE International Solid-State Circuits Conference, Session 20.4, pp. 342-344.
Himanshu Kaul et al., "A 320 mV 56 uW 411 GOPS/Watt Ultra-Low Voltage Motion Estimation Accelerator in 65 nm CMOS", IEEE Journal of Solid-State Circuits, vol. 44, No. 1, pp. 107-114, Jan. 2009.
Doyun Kim et al., "A 0.5V-Vin 1.44mA-Class Event-Driven Digital LDO with a Fully Integrated 100pF Output Capacitor", 2017 IEEE International Solid-State Circuits Conference, Session 20.6, pp. 346-348.
Doyun Kim and Mingoo Seok, "Fully Integrated Low-Drop-Out Regulator Based on Event-Driven PI Control", 2016 IEEE International Solid-State Circuits Conference, Session 8.2, pp. 148-150.
Joyce Kwong et al., "A 65 nm Sub-Vt Microcontroller With Integrated SRAM and Switched Capacitor DC-DC Converter", IEEE Journal of Solid-State Circuits, vol. 44, No. 1, pp. 115-126, Jan. 2009.
Yong-Jin Lee et al., "A 200-mA Digital Low Drop-Out Regulator With Coarse-Fine Dual Loop in Mobile Application Processor", IEEE Journal of Solid-State Circuits, vol. 52, No. 1, pp. 64-76, Jan. 2017.
Yu-Huei Lee et al., "A Low Quiescent Current Asynchronous Digital-LDO With PLL-Modulated Fast-DVS Power Management in 40 nm SoC for MIPS Performance Improvement", IEEE Journal of Solid-State Circuits, vol. 48, No. 4, pp. 1018-1030, Apr. 2013.
Ka Nang Leung and Philip K.T. Mok, "A Capacitor-Free CMOS Low-Dropout Regulator With Damping-Factor-Control Frequency Compensation", IEEE Journal of Solid-State Circuits, vol. 38, No. 10, pp. 1691-1702, Oct. 2003.
Wootaek Lim et al., "Batteryless Sub-nW Cortex-M0+ Processor with Dynamic Leakage-Suppression Logic", 2015 IEEE International Solid-State Circuits Conference, Session 8.2, pp. 146-148.
Niklas Lotze and Yiannos Manoli, "A 62mV 0.13um CMOS Standard-Cell-Based Design Technique Using Schmitt-Trigger Logic", 2011 IEEE International Solid-State Circuits Conference, Session 19.5, pp. 340-342, Feb. 23, 2011.
Yan Lu et al., "A 0.65ns-Response-Time 3.01ps FOM Fully-Integrated Low-Dropout Regulator with Full-Spectrum Power-Supply-Rejection for Wideband Communication Systems", 2014 IEEE International Solid-State Circuits Conference, Session 17.11, Feb. 11, 2014.
Yan Lu et al., "A Fully-Integrated Low-Dropout Regulator With Full-Spectrum Power Supply Rejection", IEEE Transactions on Circuits and Systems—I: Regular Papers, vol. 62, No. 3, pp. 707-716, Mar. 2015.
Saad Bin Nasir et al., "All-Digital Low-Dropout Regulator With Adaptive Control and Reduced Dynamic Stability for Digital Load Circuits", IEEE Transactions on Power Electronics, vol. 31, No. 12, pp. 8293-8302, Dec. 2016.
Yasuyuki Okuma et al., "0.5-V Input Digital LDO with 98.7% Current Efficiency and 2.7-uA Quiescent Current in 65nm CMOS", CICC., 2010.
Gabriel A. Rincon-Mora and Phillip E. Allen, "A Low-Voltage, Low Quiescent Current, Low Drop-Out Regulator", IEEE Journal of Solid-State Circuits, vol. 33, No. 1, pp. 36-44, Jan. 1998.
Wen-Jie Tsou et al., "Digital Low-Dropout Regulator with Anti PVT-Variation Technique for Dynamic Voltage Scaling and Adaptive Voltage Scaling Multicore Processor", 2017 IEEE International Solid-State Circuits Conference, Session 20.2, Feb. 8, 2017.
Alice Wang and Anantha Chandrakasan, "A 180-mV Subthreshold FFT Processor Using a Minimum Energy Design Methodology", IEEE Journal of Solid-State Circuits, vol. 40, No. 1, pp. 310-319, Jan. 2005.

* cited by examiner

```
// initially B=7'b1111111 and i=6
BinarySearch(B(6:0),i)

turn on B(i); //perturb phase

//observe phase
    if (posedge DEC)
        turn off B(i);

if (posedge INC)
        keep B(i) on;
    if i=0
        return;
    else
        return BinarySearch(B,i-1);
```

FIG. 13

| Design | [1] | [3] | [4] | [5] | This Work |
|---|---|---|---|---|---|
| Process | 65nm | 65nm | 130nm | 28nm | 65nm |
| Active area [mm²] | 0.042 | 0.029 | 0.114 | 0.021 | 0.0023 |
| Control | Time-Driven | Event-Driven | Time-Driven | Time-Driven | SAR/PD/PWM |
| $V_{IN}$ [V] | 0.5 | 0.5 – 1.0 | 0.5 – 1.2 | 1.1 | 0.5 – 1 |
| $V_{out}$ [V] | 0.45 | 0.45 – 0.95 | 0.45 – 1.14 | 0.9 | 0.3 – 0.45 |
| Load range ($I_L$) | 10μA – 250μA (25x) | 7.2μA – 3.5mA (486x) | 100μA – 4.6mA (46x) | 4mA – 200mA (50x) | 100nA – 2mA (20,000x) |
| PMOS-Array resolution | 8-bit | 10-bit | 7-bit | 6.6-bit | 7-bit |
| Effective resol. ( log₂($I_L$ range) ) | 4.6-bit | 8.9-bit | 5.5-bit | 5.6-bit | 14.3-bit |
| Load range with η>90% | 25μA – 250μA (10x) | 150μA – 500μA (3.3x) | 2.9mA-4.6mA (1.6x) | N.R. | 33.6μA – 2mA (60x) |
| $C_L$ [nF] | 100 | 0.4 | 1 | 23.5 | 0.4 |
| Quiescent $I_Q$ [μA] during load transient test | 2.7 | 12.5† | 221 | 110† | 14 |
| $V_{droop}$ @ load step size for load transient test | 40mV @ 0.2mA | 22mV @ 0.2mA | 40mV @ 0.7mA | 120mV @ 180mA | 40mV @ 1.06mA |
| Response time $T_R$ [ns] for load transient test | 20000 | 44 | 57 | 4000* | 15.1 |
| FOM** for load transient test†† | 270 | 2.75 | 18.04 | 2.44* | 0.199 |
| Load step rise/fall time for load transient test†† | N.R. | N.R. | N.R. | 4μs* | < 1ns |
| Peak current efficiency η [%] | 98.7 | 96.3 | 98.3 | 99.94 | 99.8 |
| Sampling clock range | 1MHz – 10MHz (10x) | 200MHz | 5MHz – 75MHz (15x) | N.R. | 1MHz – 240MHz (240x) |
| Load regulation [mV/mA] | 0.65 | N.R. | < 10 across range | N.R. | < 5.6 across range |
| Line regulation [mV/V] | 3.1 | N.R. | 1.1 | N.R. | 2.3 |
| Settling time [μs] | 240 | 80 | 1 | 20 | 0.1 |

N.R. = Not Reported
† $I_Q$ consumption during transient test was not reported, min($I_Q$) is assumed
* Observed from transient plots
**FOM = $C_L V_{droop}/(I_{max}-I_{min}) \times I_Q/(I_{max}-I_{min})$, P. Hazucha et al., JSSC'05
†† load rise/fall time should be < $T_R$/10 for a valid measurement

SUCCESSIVE APPROXIMATION DIGITAL VOLTAGE REGULATION METHODS, DEVICES AND SYSTEMS

PRIORITY CLAIM AND REFERENCE TO RELATED APPLICATION

The application claims priority under 35 U.S.C. § 119 from prior provisional application Ser. No. 62/454,221, which was filed Feb. 3, 2017, and incorporated by reference herein.

STATEMENT OF GOVERNMENT INTEREST

This invention was made with government support under DARPA HR0011-16-C-0037 awarded by the Defense Advanced Research Projects Agency. The government has certain rights in the invention.

FIELD

A field of invention is digital voltage regulators. Another field of the invention is system on a chip (SoC) systems. Other fields of the invention concern devices that included SoC systems, such as smailphones and tablets.

BACKGROUND

Modern sub-threshold SoC designs feature multiple power domains to dynamically track the maximum energy efficiency point (62 mV to 0.45V) in response to application demands. The following publications concern such designs.
Y. Okuma et al., "0.5-V input digital LDO with 98.7% current efficiency and 2.7-µA quiescent current in 65 nm CMOS," CICC., 2010.
A. Wang and A. Chandrakasan, "A 180-mV subthreshold FFT processor using a minimum energy design methodology," IEEE J. Solid-State 748 Circuits, vol. 40, no. 1, pp. 310-319, January 2005.
B. H. Calhoun and A. P. Chandrakasan, "Ultra-dynamic voltage scaling (UDVS) using sub-threshold operation and local Voltage dithering," IEEE J. Solid-State Circuits, vol. 41, no. 1, pp. 238-245, January 2006.
H. Kaul et al., "A 320 mV 56 µW 411 GOPS/Watt ultra-low voltage motion estimation accelerator in 65 nm CMOS," in IEEE Int. Solid-State Circuits Conf. (ISSCC) Dig. Tech. Papers, February 2008, pp. 316-616.
J. Kwong, Y. K Ramadass, N. Verma, and A. P. Chandrakasan, "A 65 nm sub-Vt microcontroller with integrated SRAM and switched capacitor DC-DC converter," IEEE J. Solid-State Circuits, vol. 44, no. 1, 758 pp. 115-126, January 2009.
A. Agarwal et al., "A 320 mV-to-1.2V on-die fine-grained reconfigurable fabric for DSP/media accelerators in 32 nm CMOS," in IEEE Int. Solid-State Circuits Conf. (ISSCC) Dig. Tech. Papers, February 2010, pp. 328-329.
N. Lotze and Y. Manoli, "A 62 mV 0.13 µm CMOS standard-cell based design technique using Schmitt-trigger logic," IEEE J. Solid-State Circuits, vol. 47, no. 1, pp. 47-60, January 2012.
M. Fojtik et al., "A millimeter-scale energy-autonomous sensor system with stacked battery and solar cells," IEEE J. Solid-State Circuits, vol. 48, no. 3, pp. 801-13, 2013.
W. Lim, I. Lee, D. Sylvester, and D. Blaauw, "8.2 batteryless sub-nW cortex-M0+ processor with dynamic leakage-suppression logic," in IEEE Int. Solid-State Circuits Conf. (ISSCC) Dig. Tech. Papers, 771 February 2015, pp. 1-3.

Analog low drop-out (LDO) regulators have shown rapid response times (e.g. $T_R$=0.65 ns) and excellent steady-state performance. However, the input voltage, Vhi, is typically brought on-chip via either a high-efficiency switching dcdc converter or an external harvesting source, both with low-voltage subthreshold or near threshold outputs (e.g., 0.5 V). Analog LDOs have difficulty operating with the which such input voltages because of low-voltage headroom. Example analog LDOs are described in the following publications.
G. Rincon-Mora and P. E. Allen, "A low-voltage, low quiescent current, low drop-out regulator," IEEE J. Solid-State Circuits, vol. 33, no. 1, pp. 36-44, 1998.
K. N. Leung and P. K. T. Mok, "A capacitor-free CMOS low-dropout regulator with damping-factor-control frequency compensation," IEEE J. Solid-State Circuits, vol. 38, no. 10, pp. 1691-1702, October 2003.
M. Al-Shyoukh, H. Lee, and R. Perez, "A transient-enhanced low quiescent current low-dropout regulator with buffer impedance attenuation," IEEE J. Solid-State Circuits, vol. 42, no. 8, pp. 1732-1742, August 2007.
M. Ho, K. N. Leung, and K.-L. Mak, "A low-power fast-transient 90-nm low-dropout regulator with multiple small-gain stages," IEEE J. Solid-State Circuits, vol. 45, no. 11, pp. 2466-2475, November 2010.
M. El-Nozahi, A. Amer, J. Tones, K. Entesari, and E. Sanchez-Sinencio, "High PSR low drop-out regulator with feed-forward ripple cancellation technique," IEEE J. Solid-State Circuits, vol. 45, no. 3, pp. 565-577, March 2010.
J. Guo and K. N. Leung, "A 6-µW chip-area-efficient output-capacitorless LDO in 90-nm CMOS technology," IEEE J. Solid-State Circuits, vol. 45, no. 9, pp. 1896-1905, September 2010. 791
J. F. Bulzacchelli et al., "Dual-loop system of distributed microregulators with high DC accuracy, load response time below 500 ps, and 85-mV dropout voltage," IEEE J. Solid-State Circuits, vol. 47, no. 4, pp. 863-874, April 2012.
Y. Lu, Y. Wang, Q. Pan, W.-H. Ki, and C. P. Yue, "A fully-integrated low-dropout regulator with full-spectrum power supply rejection," IEEE Trans. Circuits Syst. I, Reg. Papers, vol. 62, no. 3, pp. 707-716, March 2015.

Digital LDOs (DLDOs) are becoming popular in low-voltage SoC designs where they can operate reliably from supplies down to 0.5V. Typical Digital LDOs (DLDOs) replace a single saturated pMOS power transistor with an array of pMOS power transistors operating in the linear region, and can 33 operate down to 0.5 V since less headroom is required. Most switch-array-based DLDOs rely on an integral controller to linearly search (via a 1-bit ADC) for the pMOS array conductance that realizes the nearest output voltage, $V_{out}$, to the desired target, $V_{ref}$. For an N-bit control, a linear search is used and can take up to $2^N$ cycles. The following publication describe digital LDOs.
P. Hazucha et al., "High voltage tolerant linear regulator with fast digital control for biasing of integrated DC-DC converters," IEEE J. Solid-State Circuits, vol. 42, no. 1, pp. 66-73, January 2007.
Y. Okuma et al., "0.5-V input digital LDO with 98.7% current efficiency and 2.7-µA quiescent current in 65 nm CMOS," in Proc. IEEE Custom Integr. Circuits Conf., September 2010, pp. 1-4.
Y. H. Lee et al., "A low quiescent current asynchronous digital-LDO with PLL-modulated fast-DVS power management in 40 nm SoC for MIPS performance improvement," IEEE J. Solid-State Circuits, vol. 48, no. 4, pp. 1018-1030, April 2013.

S. Gangopadhyay, D. Somasekhar, J. W. Tschanz, and A. Raychowdhury, "A 32 nm embedded, fully-digital, phase-locked low dropout regulator for fine grained power management in digital circuits," IEEE J. Solid-State Circuits, vol. 49, no. 11, pp. 2684-2693, November 2014.

S. Gangopadhyay, Y. Lee, S. B. Nasir, and A. Raychowdhury, "Modeling and analysis of digital linear dropout regulators with adaptive control for high efficiency under wide dynamic range digital loads," in Proc. Design, Autom. Test Eur. Conf. Exhibit, March 2014, pp. 1-6.

W.-J. Tsou et al., "20.2 digital low-dropout regulator with anti PVT-variation technique for dynamic voltage scaling and adaptive volt-age scaling multicore processor," in IEEE Int. Solid-State Circuits Conf. (ISSCC) Tech. Dig. Papers, February 2017, pp. 338-339.

M. Huang, Y. Lu, S. P. U, and R. P. Martins, "20.4 an output-capacitor-free analog-assisted digital low-dropout regulator with tri-loop control," in IEEE Int. Solid-State Circuits Conf. (ISSCC) Tech. Dig. Papers, February 2017, pp. 342-343.

D. Kim, J. Kim, H. Ham, and M. Seok, "20.6 A 0.5V-VIN 1.44 mA-class event-driven digital LDO with a fully integrated 100 pF output capacitor," in IEEE Int. Solid-State Circuits Conf. (ISSCC) Tech. Dig. Papers, February 2017, pp. 346-347.

More recent digital LDOs have proposed adding a proportional term via a multi-bit analog-to-digital converter ADC. However, the achievable response times are 44-4000 ns, which is insufficient for many digital loads. This approach with the added proportional term is discussed in the following publications.

D. Kim and M. Seok, "8.2 fully integrated low-drop-out regulator based on event-driven PI control," in IEEE Int. Solid-State Circuits Conf. (ISSCC) Tech. Dig. Papers, January 2016, pp. 148-149.

Y.-J. Lee et al., "A 200-mA digital low drop-out regulator with coarse-fine dual loop in mobile application processor," IEEE J. Solid-State Circuits, vol. 52, no. 1, pp. 64-76, January 2017.

Digital LDOs often suffer from limited dynamic range over which the load is regulated and stable, and the DLDOs occupy a large active area due to barrel-shifter-based control. Typical prior DLDOs, like the one shown in FIG. 1, utilize a $2^N$ unary-sized PMOS array driven through a $2^N$ bit barrel-shifter that increments or decrements array conductance by a single (or a small number of) fingers per CLK cycle, resulting in a linear search over upwards of $2^N$ cycles, which results in a $2^N/N$ longer settling time than the proposed scheme. Typical LDOs occupy a large area with $2^N$ D flip-flops (DFFs) in the area-dominant barrel-shifter. The barrel shifter accumulates 0's or 1's depending on the comparison: $V_{OUT} < V_{REF}$. As shown in FIG. 1B, the DLDO of FIG. 1B requires $\sim 2^N \times T_{CLK}$ to reach a desired $V_{REF}$.

SUMMARY OF THE INVENTION

An embodiment of the invention is a low power voltage regulator. The regulator includes a weighted transistor array having a plurality of transistor switches with a total conductance of G, the switches corresponding to bits ranging from a most significant bit (MSB) to a least significant bit (LSB). A transistor switch corresponding to the MSB has a conductance of G/2 and remaining bits have a consecutive descending conductance of $G/2^N$ to the LSB, and further including a redundant LSB transistor switch having the same $G/2^N$ conductance of the LSB. A search controller conducts a binary search by turning on respective ones of the plurality of transistor switches beginning with the MSB to find a total conductance value of the weighed transistor array that realizes the nearest output voltage to a desired target output voltage. A LSB controller enables the redundant LSB transistor in response to steady-state errors. An overshoot controller interrupts the search controller in response to voltage or current step changes that are large enough to cause predetermined amounts of overshoot or undershoot. A proportional derivative controller compensates an output voltage from the weighted transistor array. In preferred embodiments, the search controller conducts a recursive successive approximation by turning on bits from the MSB to the LSB for coarse control within a coarse range of the target voltage and then the overshoot controller conducts fine control after the coarse control determines a predetermined number of MSB bits to turn on to achieve the coarse range. The overshoot controller can be a hysteretic dual-bound bang-bang controller that resets the search controller to conduct coarse control if the output voltage falls out of a regulation boundary, and can control the binary search to a fraction of the LSB. The proportional derivative controller preferably cancels an output pole to provide a single pole voltage output.

A preferred method for proportional derivative digital compensation of a voltage regulator includes generating an output voltage in a voltage regulator targeting a target voltage and eliminating an output pole of the voltage regulator to provide a stable voltage regulator operation irrespective of load current, load capacitance, or sampling frequency. The step of eliminating the output pole can avoid oscillatory behavior in response to the slope of the output achieving a correct polarity by discontinuing output approximation and allowing the compensation to stabilize the output voltage.

A preferred method for duty cycle regulation of a digital voltage regulator includes generating an output voltage in a voltage regulator targeting a target voltage with a plurality of bits from a most significant bit to a least significant bit, and adding additional effective number of to increase a resolution limit of the digital voltage regulator by regulating voltage below the least significant bit of the digital voltage regulator through pulse-width-modulation of an additional LSB (least significant bit) switch.

BRIEF DESCRIPTION OF THE DRAWINGS

FIG. 13 is pseudo code for control logic of a preferred successive approximation controller (SAR) in the FIG. 2A RLDO; and FIG. 14 is a table comparing performance of a fabricated RLDO consistent with FIG. 2A to state-of-the-art prior voltage regulators.

DETAILED DESCRIPTION OF THE PREFERRED EMBODIMENTS

Figure 1A:
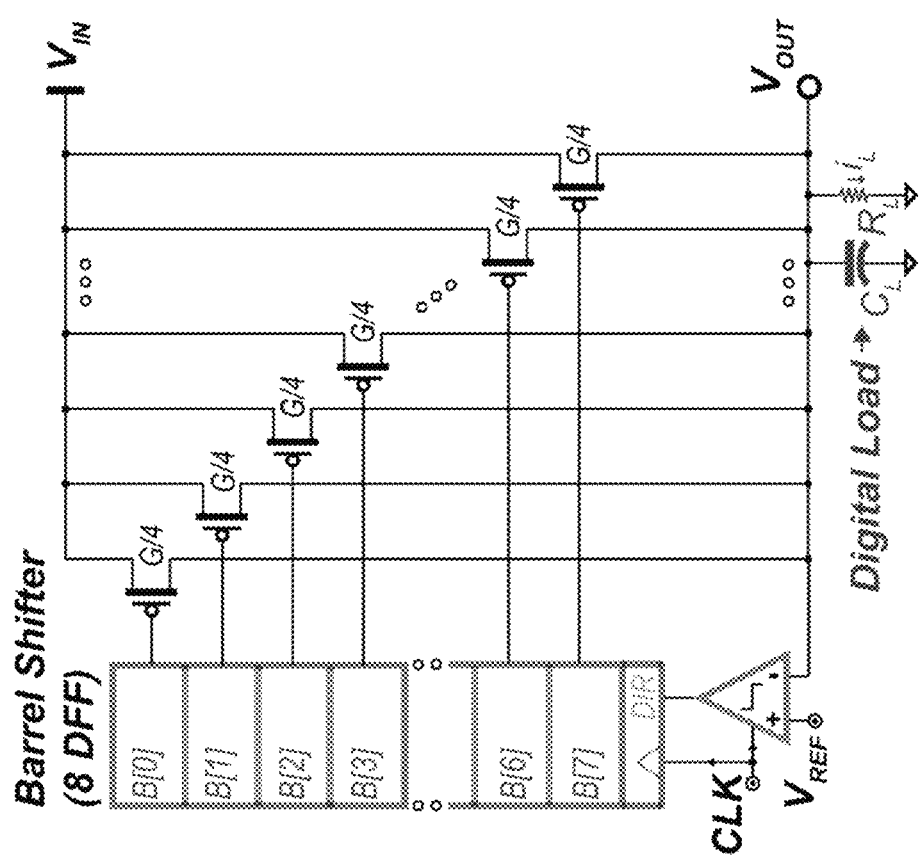
FIG. 1A (prior art) illustrates a conventional digital low drop-out (DLDO) regulator that includes a $2^N$ bit barrel-shifter employed to conduct a linear search and FIG. 1B (prior art) illustrates the linear search that requires takes $\sim 2^N \times T_{CLK}$ to reach a desired $V_{REF}$.
Figure 1B:
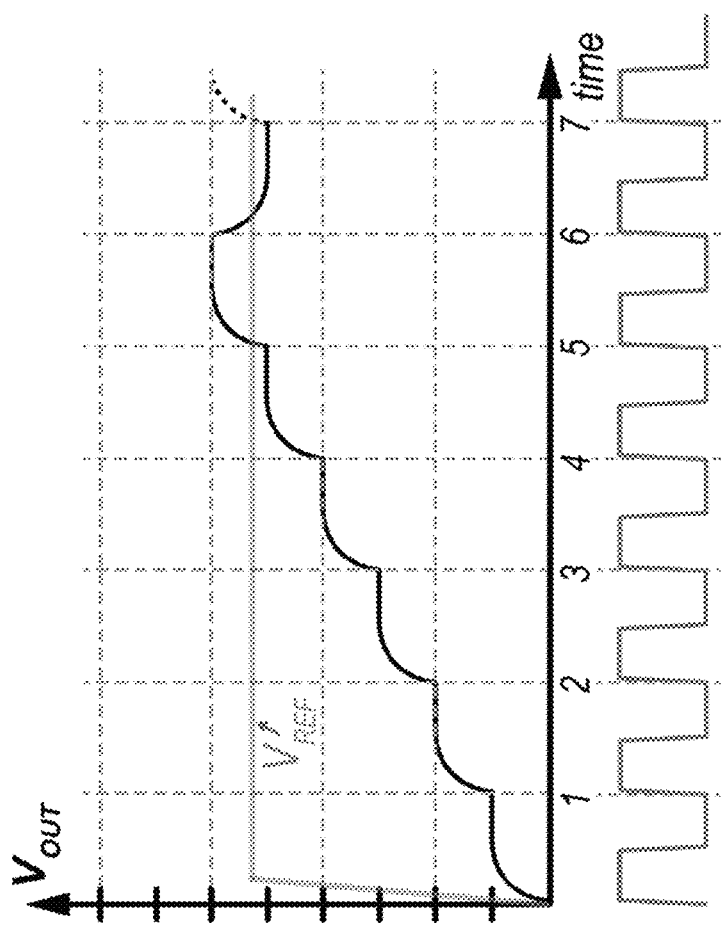

Preferred embodiments provide a recursive all-digital LDO (RLDO) circuits and methods that enable stable and pragmatic binary searches, and avoid large staircase overshoots/undershoots during binary search steps by operating from a clock whose frequency is faster than the time constant of the load. Stability is provided by a variable-coefficient proportional derivative compensation. Steady-state errors are avoided with hysteretic pulse width modulation (PWM) control that also enables sub-LSB (least significant bit) load current regulation. Loop-interruption logic avoids large overshoot/undershoot that can result from a sudden $I_L$ or $\Delta V_{IN}$ step change occurs in during the binary search [after deciding the first few most significant bits (MSBs)].

A preferred embodiment recursive all-digital LDO (RLDO) consists of a binary weighted PMOS switch array controlled by a recursive successive approximation (SAR) controller that performs coarse regulation via a recursive binary search to rapidly find the array conductance value that realizes the nearest $V_{OUT}$ to $V_{REF}$. At each +ve CLK edge, the PMOS array is sequentially turned-on from MSB to LSB in N cycles; and bit decisions occur at the -ve edge.

Unlike prior DLDOs which enter limit cycle oscillations and suffer from periodic 20-50 mV ripple, a hysteretic dual-bound bang-bang controller is enabled in preferred embodiments after the SAR controller decides the LSB, producing a PWM (pulse with modulation) signal that enables sub-LSB regulation for the first time in a digital LDO. Duty control extends the effective RLDO LSB by $f_L/f_s \times I_{single\_finger}$, where $f_L=1/(R_p||R_LC_L)$ is the output pole frequency. The entire SAR controller is clock-gated at steady-state, and only a single D Flip Flop is clocked for duty-control, reducing quiescent power by $\frac{1}{2}^N$ over conventional DLDOs. If $V_{OUT}$ falls out of regulation bounds during duty-control, an event-driven trigger signal is asserted and the coarse SAR loop is re-activated.

In order to realize faster $T_R$ in preferred embodiments, integrator gain, G[k], is set to G via the MSB (most significant bit) switch at the 1$^{st}$ SAR iteration, expanding the loop bandwidth and momentarily rendering the system quasi-stable. Then, G[k] undergoes a dynamic binary-subsiding loop gain (DBS-LG) algorithm towards G/64, rendering an overdamped and stable response near settling while achieving provably $2^{N-2}$ faster response-time. Since during steady-state there are $2^N$ fewer elements switching in the RLDO compared to conventional DLDOs, a $2^N$ faster CLK can be employed for the same $I_Q$ to further augment the proposed DBS-LG algorithm, for a net $2^{2N-2}$×increase in $T_R$.

In prior DLDOs when $f_s > f_L$ at light loads, $V_{OUT}$ changes much more slowly than the decision of the controller, which would rapidly accumulate more zeros/ones in the shifter than necessary, resulting in an oscillatory response. To avoid this, the integrator can be incremented (+1 state, INC=1) only if $V_{OUT} < V_{REF}$ (proportional term) and $V_{OUT}$ has a −ve slope (differential term). Likewise, the integrator is decremented (−1 state, DEC=1) only if $V_{OUT} > V_{REF}$ (proportional term) and $V_{OUT}$ is trending upwards, which accomplishes the control action of a proportional-derivative (PD) compensator. This way, the PD compensator inserts a 3$^{rd}$ state (0 state, neither increment nor decrement) which effectively adapts the integrator operating frequency $f_c=f_s/m$ with the output pole frequency, $f_L$, establishing a multi-rate fast-slow digital control loop to maintain the output pole $z=e^{-f_L/f_s}$ inside the unity circle. Essentially, the PD compensation inserts a zero at $s=-K_P/K_D$ that cancels the output pole and enables a single pole system (PM >90°), irrespective of $C_L$, $I_L$, and $f_s$.

A preferred all-digital PD compensator uses two PWM comparators, COMP_H and COMP_L, to implement the proportional term, while comparator DIFF_L implements the differential term, with replica path DIFF_H used to reject charge injection and kickback. Addition of the P&D terms is performed by supplying the sampling clocks of DIFF_H & DIFF_L from COMP_H & COMP_L, respectively. By enabling S/H from INC and DEC instead of CLKH and CLKL, $\Delta V_{OUT}$ accumulates and becomes $V_{OUT}[k]-V_{OUT}[k-m]$, overpowering kT/C noise. The produced INC is used to turn on the next PMOS in the PMOS DAC array while DEC turns off the present bit. CLKH and CLKL produce the PWM signal once the LSB is decided. A double-tail regenerative comparator is employed to enable 4× higher speed for the same $I_Q$ at 0.5V. A body-bias offset cancellation scheme in a 2$^{nd}$ latching stage eliminates calibration capacitors in the signal path, improving energy/cycle by >10× while enabling +/−50 mV (>3σ) offset control for +/−200 mV of body bias.

A preferred example implemented RLDO was fully integrated in 0.0023 mm$^2$ of active area in 65 nm; $C_L$ is 0.4 nF. Transient response for $V_{IN}$=0.5V and $V_{REF}$=0.45V for periodic on-chip load changes between 40 µA and $I_{max}$=1.1 mA was measured within 1 ns. The example RLDO maintains <40 mV undershoot for $I_Q$=14 µA at $f_s$=100 MHz, thereby achieving a $T_R$ of 15.1 ns with a settling time of 100 ns. In contrast, a modeled 65 nm DLDO with the same fan-out capability has 25× and 13.7× slower $T_R$ and settling times, respectively, with $2^7 \times I_Q$. The RLDO achieves a FOM of 199.4 ps at $V_{IN}$=0.5V, while the modeled DLDO achieves 638 ns. The RLDO measured overshoot is 62 mV, after which $V_{OUT}$ is regulated by the duty controller to its steady-state value of 0.45V. Stable load step tests were performed even with a 1 µF external capacitor to make the output pole, $f_L$, 2500× more dominant than $f_s$=100 MHz, which would render conventional DLDOs fully oscillatory, but did not have such an effect on the example implemented RLDO.

The example RLDO with SAR control of the binary array, duty controller, and DC correction loop, achieves load regulation from 100 nA to 2 mA (a 20,000× dynamic range) for $f_s$=10 MHz and $V_{IN}$=0.5, illustrating an extension of the effective resolution from 7b to 14.3b with a worst-case regulation of 5.6 mV/mA. At $f_s$=100 MHz and $I_L$=1 mA, line regulation of 2.3 mV/V is achieved. The RLDO achieves a peak current efficiency of 99.8% for 0.5-to-0.3V with efficiency >90% from 33.6 uA to 2 mA, i.e. 60× range, and greater than 84.4% efficiency across a 50× load dynamic range for 0.5-to-0.45V, which exceeds conventional DLDO designs by 46.4%. Tests showed that the example RLDO at 0.5V achieves the fastest response and settling times, largest load dynamic range, smallest area, and best FOM (normalized figure of merit, see, P. Hazucha, T. Karnik, B. A. Bloechel, C. Parsons, D. Finan, and S. Borkar, "Area-efficient linear regulator with ultra-fast load regulation," IEEE J. Solid-State Circuits, vol. 40, no. 4, pp. 933-940, 847 April 2005).

An example preferred embodiment of the invention provides a 0.5V 0.0023 mm² recursive all-digital LDO (RLDO) in 65 nm with hybrid PD-SAR and PWM duty control that achieves 15.1 ns and 100 ns response and settling times, while maintaining 5.6 mV/mA load regulation and loop stability across a 20,000× dynamic load range, eclipsing state-of-the-art active area, response time, settling time, and dynamic range metrics across prior-art digital LDOs by over an order of magnitude. Preferred embodiments of the invention will now be discussed with respect to the drawings and experimental devices. The drawings may include schematic representations, which will be understood by artisans in view of the general knowledge in the art and the description that follows. Features may be exaggerated in the drawings for emphasis, and features may not be to scale.

Figure 2A:
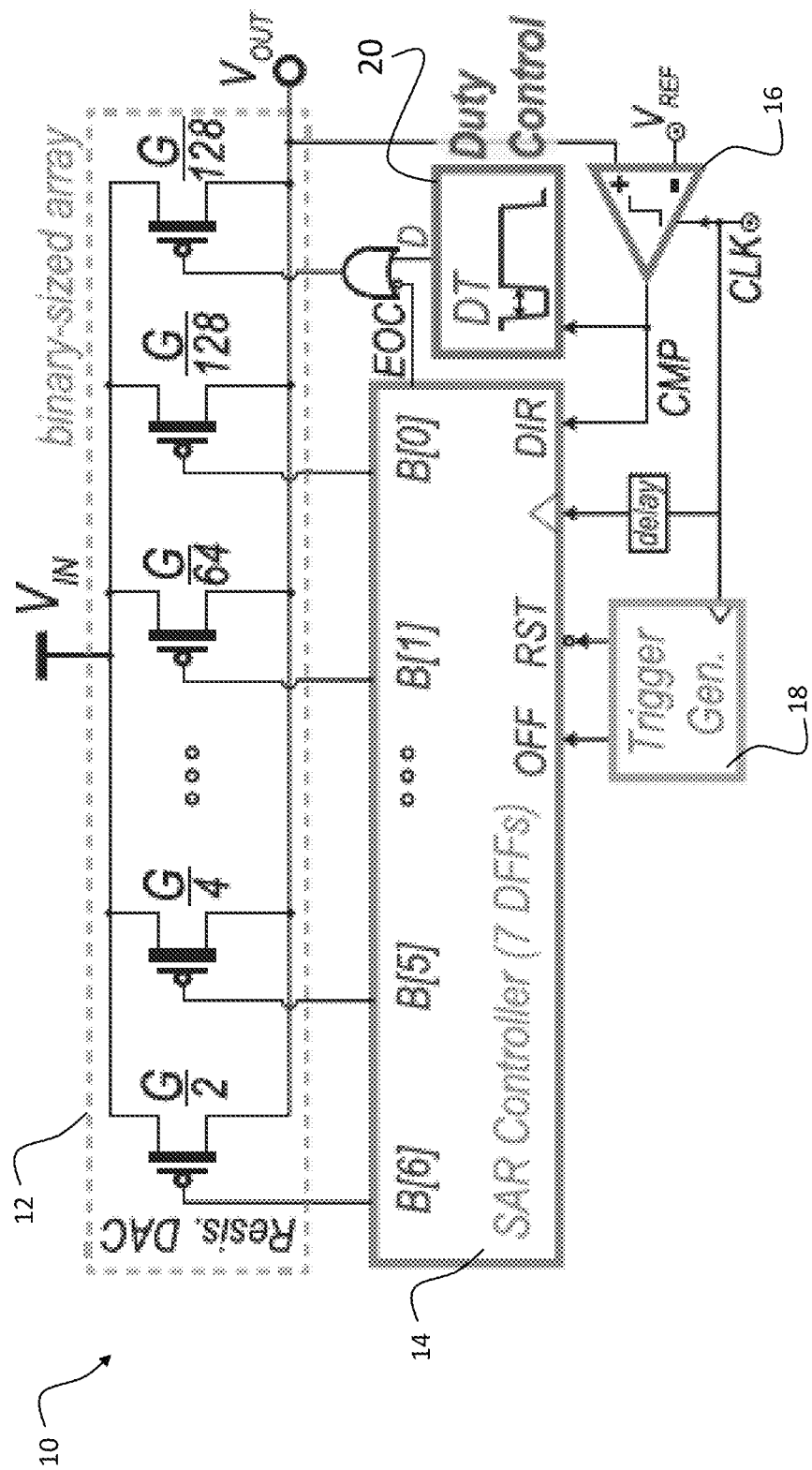
FIG. 2A is a block diagram of a preferred embodiment RLDO (recursive digital low drop-out regulator) that provides a binary search and FIG. 2B compares the search of the preferred embodiment RLDO to that of the conventional DLDO of FIGS. 1A-1B.
Figure 2B:
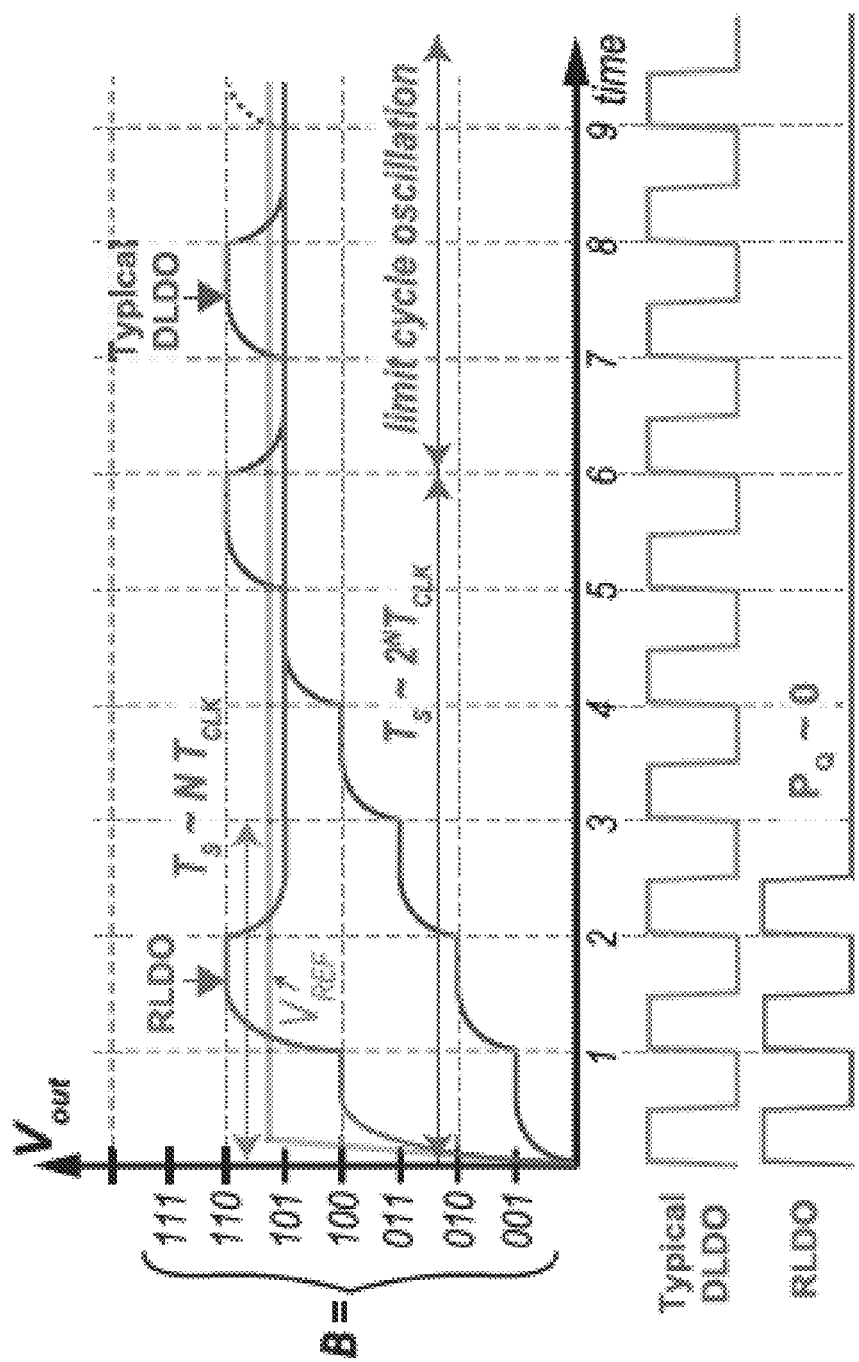
FIGS. 2C and 2D illustrate a preferred successive approximation controller of the FIG. 2A RLDO.

FIG. 2A shows a preferred embodiment RLDO 10. The RLDO includes an array 12 of N binary-weighted pMOS switches (pMOS DAC), having conductance of $$\frac{G}{2}, \frac{G}{4}, \frac{G}{8} \cdots \frac{G}{128},$$

with a total conductance G, controlled via a successive approximation register (SAR) 14. An NMOS implementation is an alternative, as is an array of transmission gate switched (PMOS in parallel to NMOS). Additionally, the PMOS or NMOS switch can have a resistor in series. For example, each PMOS switch in FIG. 2A can have a series resistance where the PMOS switch acts as an on or off low-resistance switch. FIG. 2B shows the transient $V_{out}$ response of a representative 3-bit binary search for a 0-to-$V_{ref}$ input reference step (only 3 bits are shown for illustrative simplicity). In the example for ease of illustration, $f_{CLK}$ is set to be slower than the rate of change of $V_{out}$ to allow enough time for $V_{out}$ to settle before taking each bit-decision. The pMOS array 12 is initially turned off. At the first positive edge after $V_{ref}$ step-increase, a comparator 16 output goes to high, and under binary search a most significant bit B[6] switch G/2 is turned on. As a result, $V_{out}$ starts to increase from zero initial voltage until it settles at the corresponding G/2 voltage level. At the following positive clock, $V_{out}$ is still less than $V_{ref}$, therefore, the next most significant switch B[5] in the array 12 is turned on, which increases $V_{out}$ to the (¾)G voltage level. At the third clock cycle, $V_{out}$ is larger than $V_{ref}$, and therefore, the SAR register 14 turns off the second bit, B[1], while simultaneously turning on the least significant bit B[0].

Figure 2C:
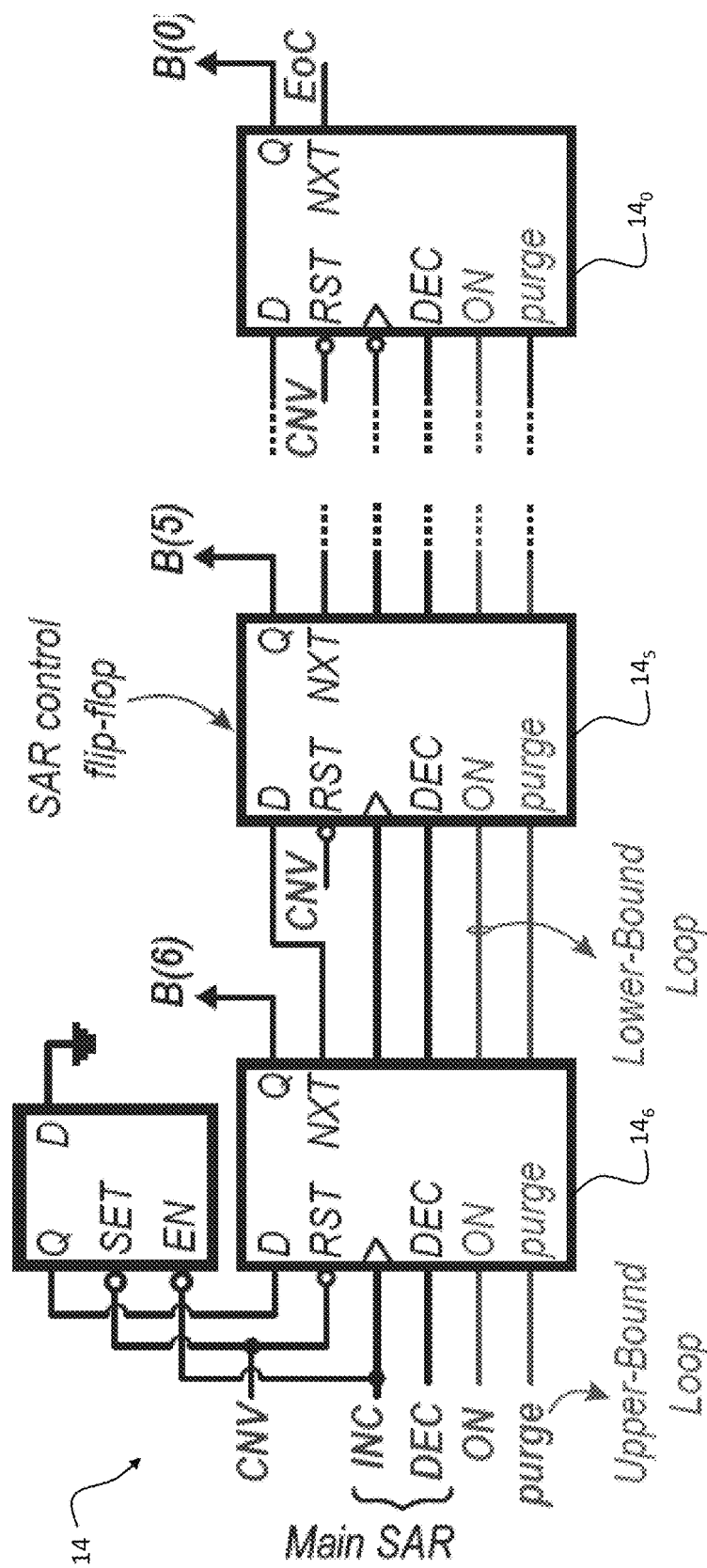
Figure 2D:
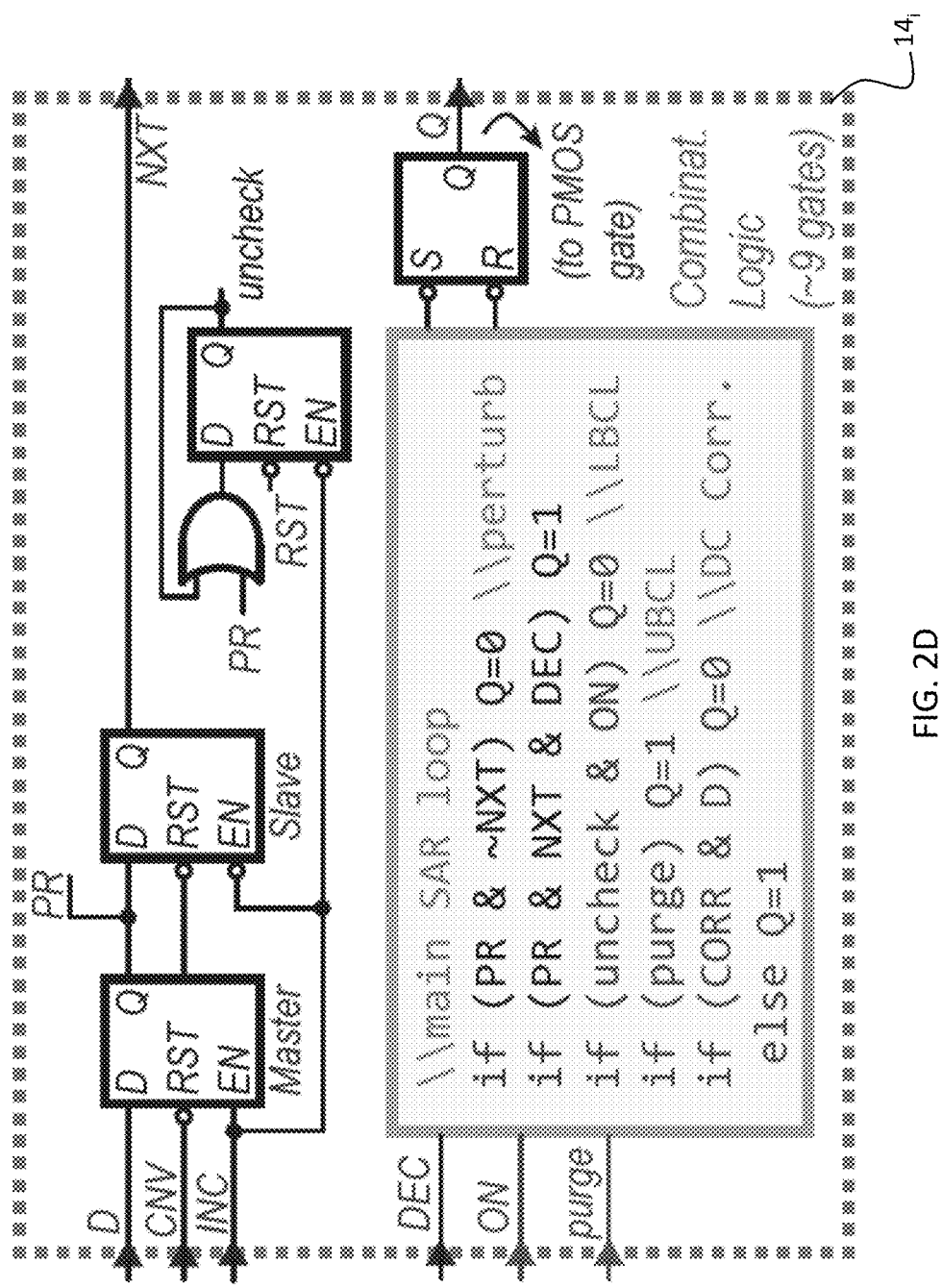

FIG. 2B shows that the present RLDO 10 achieves $2^N/N$ faster settling time than the FIG. 1A conventional DLDO. The SAR controller 14 requires only N D Flip Flops instead of $2^N$ D flip flops (see FIGS. 2C and 2D) for a barrel shifter, reducing control area by $2^N/N$. Along with a $2^N/N$ reduction in the number of cycles to reach $V_{ref}$, clock power is thus reduced by $N^2/2^{2N}$. The RLDO 10 also does not suffer from limit-cycle oscillations evidenced by the conventional FIG. 1A DLDO. The present RLDO 10 provides $\frac{1}{2}^N$ lower quiescent current, $I_Q$, and higher current efficiency. The entire SAR controller is gated by a clock generator 18 and only a single D flip flop is clocked during duty control implemented by a duty controller 20. The clock generator 18 can use an SoC or load clock, but trigger generation can reset or interrupt operation of the controller 14. FIGS. 2C and 2D illustrate a preferred example implementation of the SAR controller 14, in which an output of each D flip flop is connected to a corresponding switch of the switch array (directly or through a buffer). The implementation of the preferred SAR pseudo code is shown in FIG. 2D. The example SAR controller 14 consists of seven D flip flops (FFs) B(6:0) $14_6$-$14_0$ and essentially acts as a shift register, as shown in FIG. 2C. The gate voltage of each binary-weighted PMOS switch in the array 12 is controlled through an SR-latch within the corresponding SAR control FF, as in FIG. 2C. During the perturb phase, a given Ni bit, B(Ni), in the switch array is turned on during its respective $i^{th}$ INC cycle in order to test its output current value relative to the load current, $I_L$.

To realize the sequential perturb operation, each SAR FF is implemented using two D-type latches that are connected in a master-slave configuration, as shown in FIG. 2D. The output of the slave latch within the Ni control FF is connected to the master latch input of the following Ni-1 FF. The clock input of both D latches within each control FF of the SAR register is connected to INC, as in FIG. 2D.

Initially, when {CNV} transitions from 1 to 0, the output of every master and slave latch within each SAR FF is set low, except for the master latch in the MSB control FF, B(6). Therefore, the MSB master latch output {PR} is set to 1 while {NXT} in the MSB FF is 0. As a result, the combinational logic block inside the MSB control FF turns on the MSB PMOS switch in the array 12 through the SR latch.

When $V_{out}$ falls below $V_{ref, L}$ for two consecutive clock cycles, {CNV} transitions from 1 to 0 through the lower-bound trigger logic. As a result, the master latch output {PR} within the MSB control bit is reset low. In this case, {PR} is 0 while {NXT} is 1, therefore, the combinational logic block inside the MSB control bit turns on the MSB PMOS switch in the array, as in FIG. 2D.

The observe phase is initiated at the falling edge of INC. If the MSB current, $I_{MSB}$, is larger than the load current, $I_L$, the output voltage $V_{out}$ starts to increase towards $V_{ref,L}$. When $V_{out}$ exceeds $V_{ref,H}$, {DEC} is asserted, and consequently, the MSB is turned off through the combinational logic in the MSB control FF, in FIG. 2D, where {PR} is 0 while {DEC} is 1. On the other hand, $I_{MSB}$ is smaller than $I_L$, and therefore, $V_{out}$ continues to fall below $V_{ref,L}$ although the MSB switch is turned on, which asserts a new {INC} pulse and therefore the bubble propagates to the next MSB in the SAR control register while the MSB switch is left turned-on. Conversion proceeds in this manner for each subsequent MSB until all the bits in the switch array have been determined. At the $N^{th}$ rising edge of the {INC}, the LSB PMOS switch is turned on, while at the $N^{th}$ falling edge of the {INC}, the end-of-conversion {EoC} is set high, where {EoC} is connected to the complement of the slave latch output within the LSB control FF. This initiates the final $N^{th}$ observe phase and simultaneously flags the end of the SAR operation which enables the duty-cycle controller.

The preferred SAR controller is implemented through a dual-edge logic where it operates at both the rising and falling of {INC} to enable fast response time, $T_R$, of the RLDO.

The SAR conversion is accomplished by a sequence of N perturb-and-observe phases. This represents the backbone of the preferred SAR controller. The core operation of the SAR controller can be interrupted to account for a sudden disturbance, i.e. $\Delta I_L$ or $\Delta V_{in}$, during the N-step SAR-conversion process. As discussed, {ON} is set high through the branch-prediction scheme in the lower-bound trigger logic when a sudden load current increase $+\Delta I_L$ or input voltage decrease $-\Delta V_{in}$ causes the output voltage $V_{out}$ to fall below the lower bound $V_{ref,L}$ for two consecutive {INC} pulses.

When {ON} transitions from 0 to 1, the remaining m unchecked bits in the SAR register should be instantly turned on. Therefore, a flag uncheck is incorporated within each control FF to mark whether a given PMOS bit has been checked or not, using the D latch and OR-gate in FIG. 2D. Initially, uncheck of each bit, except for the MSB, is reset zero through the active-low reset signal CNV. On the other hand, at the $i^{th}$ {INC} rising edge, uncheck transitions from 0 to 1 within the $i^{th}$ SAR control bit. At the rising edge of {ON}, the unchecked SAR bits are instantly turned on through the combinational logic within each SAR control FF in FIG. 2D, according to the condition if (uncheck & ON) then Q=0. This way the unchecked bits are turned on instantly with the rising edge of the second {INC} pulse in a two-consecutive-{INC} event without any extra cycle delay.

The N-step SAR search can be interrupted during its conversion when a sudden load current decrease $-\Delta I_L$ or input voltage increase $+\Delta I_{in}\%$ invalidates the already determined SAR bits and thereby causes V_{out} to exceed $V_{refH}$ for two consecutive {DEC} pulses, which indicates the erroneous value of the already determined bits. Therefore, the upper-bound trigger logic asserts {purge} to immediately flush the pipeline and turn off the whole PMOS array.

On the other hand, when {purge} is asserted, the combinational logic within each SAR control FF immediately turns off the whole PMOS array, according to the condition if (purge) then Q=1, as shown in FIG. 2D. As for the DC correction loop, when the DC correction flag {CORR} is asserted, the SAR logic in FIG. 2D temporarily turns on the next MSB in the switch array according to the condition if (CORR & D) then Q=0.

On the other hand, when {purge} transitions from 0 to 1, the combinational logic within each SAR control FF instantly turns off the corresponding PMOS switch as shown in FIG. 2D, according to the condition if (purge) then Q=1.

The preferred SAR logic realizes better energy-delay metric as compared to the conventional scheme in SAR ADCs. The preferred SAR register employs dual-edge triggered logic to reduce latency and enable fast response time. The conventional scheme instead incorporates a ring counter and a shift register which requires at least 2N flip-flops to implement the required binary search algorithm. On the other hand, the backbone of the preferred embodiment SAR controller requires only N flip-flops, two D-type latches, which realizes exponentially $2^N/N$ smaller area and dynamic clock power than a barrel shifter in conventional DLDO. In addition, the present SAR register consumes two times smaller area and clock power than the typical register implementation in ADCs. The bit-setting logic within each SAR control bit only requires nine gates, two-input NANDs and NORs.

Figure 3B:
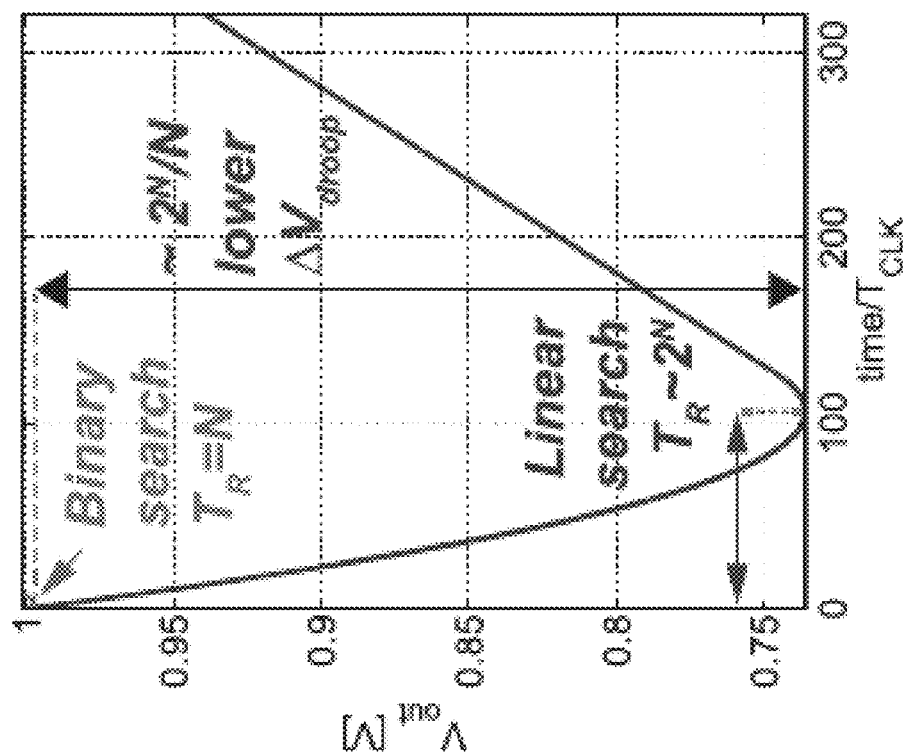
FIGS. 3A and 3B compare the transient $V_{out}$ response of a 7-bit linear search (FIG. 1A) and binary search (FIG. 2A) to 0-to-$I_{Lmax}$ load step, respectively close-in and far-out, when both have the same total array conductance, G, where $G\Delta V_{dropout}$ matches $I_{Lmax}$.
Figure 3A:
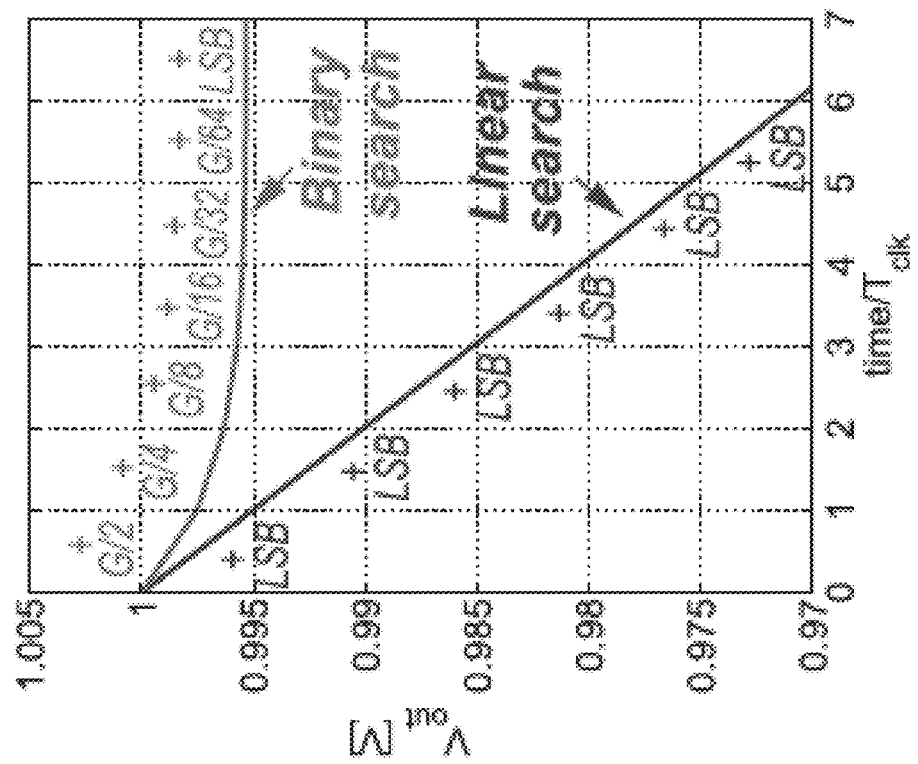

FIGS. 3A and 3B illustrate that the FIG. 1A DLDO turns on only a single finger (with an LSB conductance) of $G/2^7$) after the load step. In contrast, the FIG. 2A RLDO 10 turns on half of the total array 12 conductance, G/2, after the first clock cycle. With the second clock cycle, the RLDO 10 turns on an additional quarter of the array 12 conductance, G/4. Additional clock cycles continue to add half the remaining total array conductance. Thus, only N clock cycles are needed to respond to a full load step compared to $2^N$ for the FIG. 1A DLDO. The RLDO 10 provides both the much smaller response time and a smaller $V_{droop}$. When sudden load current increase from zero to $I_{max}$ occurs, $I_{max}$ is temporarily provided from the output decoupling capacitor until the delay ($T_R$) of the loop to create a response passes. Since $I_{max}$ is provided from the output decoupling capacitor for $T_R$ seconds, the output voltage drops by a delta V equal to the charge taken from the output capacitor $I_{max} \times T_R$ divided by $C_{out}$ (the output capacitance). This temporal delta V is called the voltage droop $V_{droop}$.

Figure 4A:
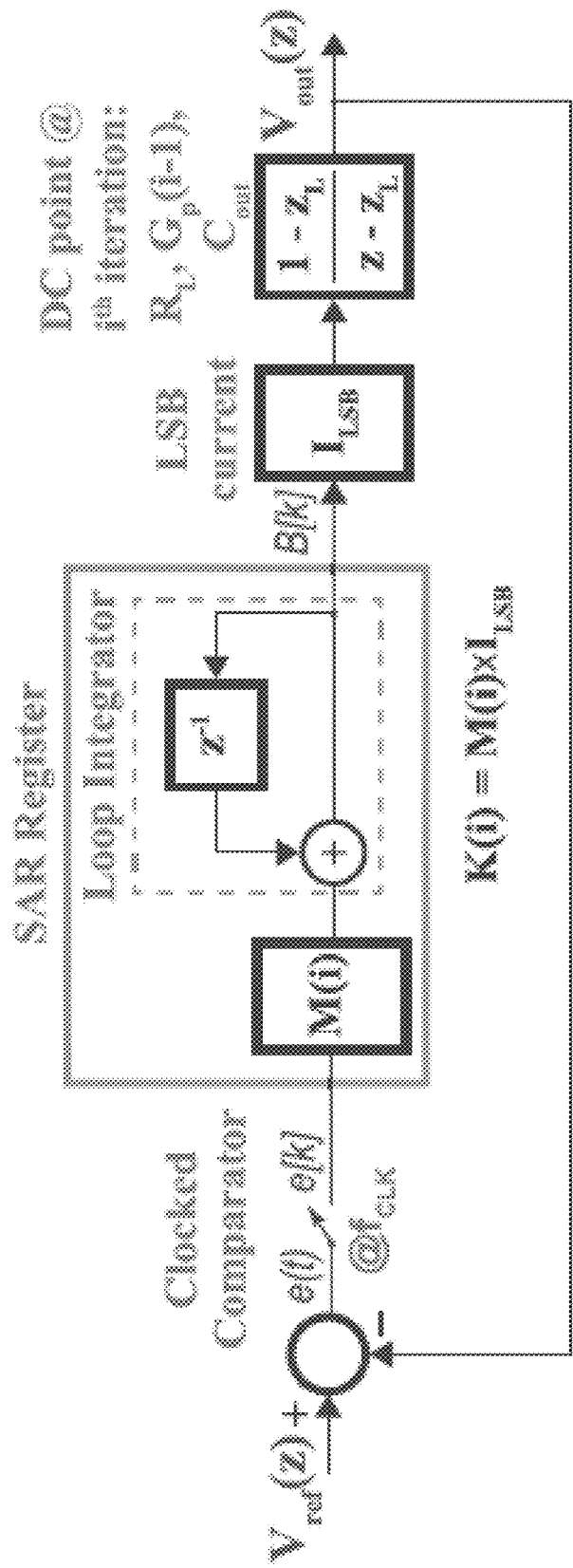
FIGS. 4A-4C are respectively a small-signal AC model without proportional derivative control, Bode diagram, and a small-signal AC model with proportional derivative control of the FIG. 2A RLDO.

FIG. 4A shows that, without proportional derivative (PD) compensation in the FIG. 2A RLDO 10, the initial load conductance, $G_L = 1/R_L$ and the initial (i.e., prior to the $i_{th}$ iteration) pMOS array conductance, $G_p(i-1)$ establish the DC operating point around which the AC response to the input small-signal disturbance, $\Delta V_{ref}$, is evaluated. The comparator (16 in FIG. 2A and modeled in FIG. 4A) quantizes the input error signal $e(t)=V_{ref}-V_{out}(t)$. In the beginning of the conversion, the SAR controller (14 in FIG. 2A) has the highest gain (via switching the MSB conductance) to facilitate a rapid response time via a large loop bandwidth. As the successive approximation converges, the step size at the $i^{th}$ iteration decreases (i.e., $M(i) \times LSB = G/2^i$), and thus the gain, K(i), decreases in a binary-subsiding manner, until the gain reaches the LSB value. For the purpose of stability analysis, the SAR register is assumed to accumulate the instantaneous error, M(i)e[k] rather than M(i)e[i], to determine the number of turned on pMOS fingers, B[k]. The zero-order-hold equivalent of the output RC network comprising Gp(i-1), $R_L$, and Cout, can be found as $(1-z_L)/(z-z_L)$, where $z_L = e^{-f_L/f_{CLK}}$ is the output pole, which is determined by the ratio between the equivalent output-load frequency, $f_L=(G_L+G_p(i-1))/C_{out}$, and the sampling clock, $f_{CLK}$. Therefore, the open-loop transfer function of such a second-order feedback control loop is given by:

$$G(z) = \frac{K(i)(1-z_L)z}{(z-1)(z-z_L)} \quad (1)$$

G(z) has two poles: the loop integrator pole on the unity circle (z=1) and the output pole, $Z_L$. The open-loop gain G(s) of the corresponding continuous-time system using impulse-invariance transformation is given by:

$$G(s) = \frac{w_n^2}{s(s + 2\eta w_n)} \quad (2)$$

Therefore, the open-loop gain G(s) contains two poles, where the Z-domain poles, z=1 and $Z_L$ map to the s=0 and $f_L$ in the s domain.

Figure 4B:
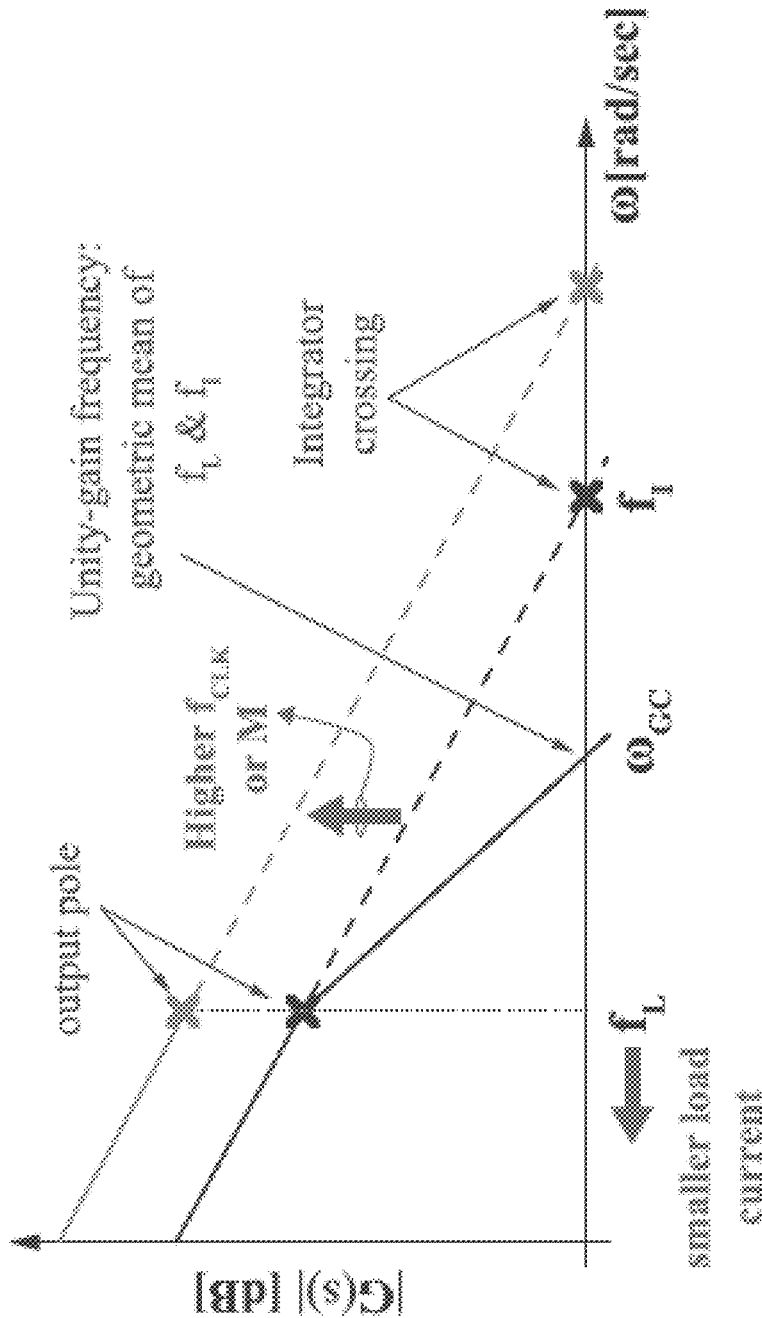

FIG. 4B illustrates the Bode diagram of a DLDO, where the integrator pole (s=0) asymptote intersects the 0-dB axis at $f_I=\omega_n/(2\pi)$. It can be shown that $f_I=\beta\ f_{CLK}\ \ln(M(i)\times LSB+1)$, where $\beta$ is a proportionality factor less than unity. Therefore, for a given output-load frequency, $f_L$, increasing the sampling frequency, $f_{CLK}$, or the array conductance step, M, both serve to increase $f_I$, which shifts the magnitude plot upward, as shown in FIG. 4B. This boosts the unity-gain frequency or loop bandwidth, $\omega_{GC}=(f_L\ f_I)^{1/2}$, and hence enables a faster response time; however, at a reduced phase margin (PM) and stability as set by: PM=$90°-\tan^{-1}\ (f_I/f_L)^{1/2}$. This speed-stability tradeoff sets the allowable values for the design variables $f_{CLK}$ and M, and hence the upper bound on the achievable response time for a given design.

Figure 5B:
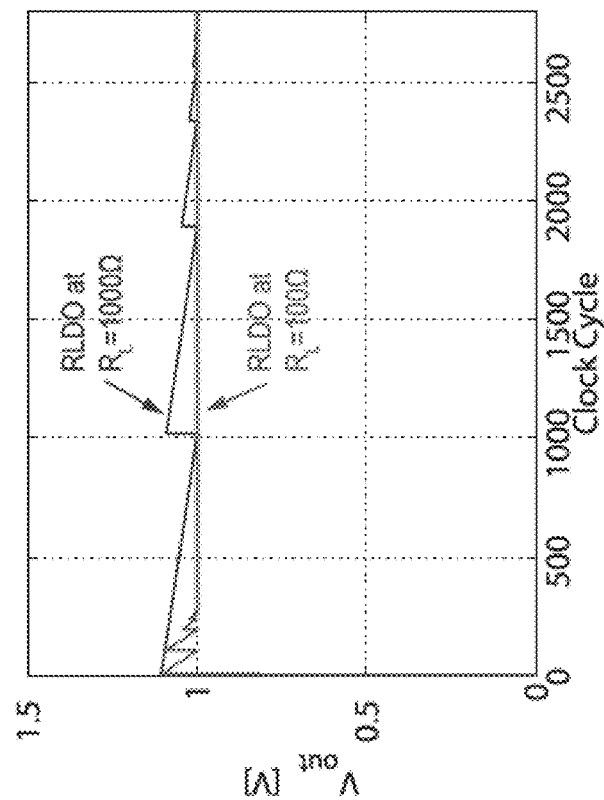
FIGS. 5A and 5B illustration simulations of Vout for a RLDO in accordance with FIG. 2A and a DLDO in accordance with FIG. 1A.
Figure 5A:
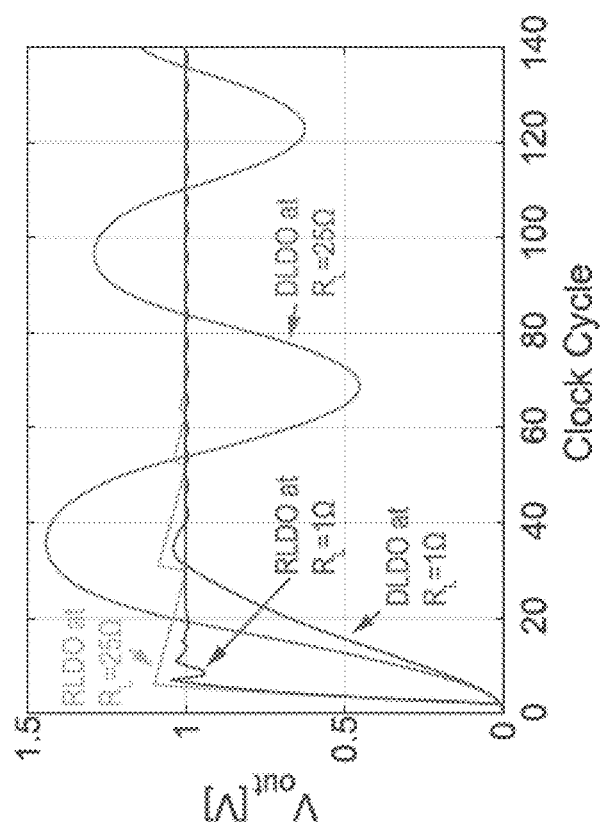

FIGS. 5A and 5B illustration simulations of Vout for a present RLDO and a DLDO in accordance with FIG. 1A. Specifically, FIG. 5A includes transient $V_{out}$ simulations of a 7-bit RLDO of FIG. 2A with PD compensation, and a 7-bit DLDO of FIG. 1A at peak current $R_L$=25Ω ($V_{in}$=2V, $V_{ref}$=1V, G=5Ω$^{-1}$, $C_{out}$=1/(2π); FIG. 5B modes a PD-compensated RLDO at $R_L$=100 and 1000Ω. The RLDO $V_{out}$ overshoot, due to MSB turn on, can be reduced with higher sampling frequency, $f_{CLK}$. The simulations show that the speed-stability tradeoff becomes tighter with reduced current values: at a fixed $f_{CLK}$ and M, $f_L$ becomes more dominant with smaller loads, which increases the relative separation between the two poles ($f_L$ and $f_I$) and hence reduces the PM and eventually results in an oscillatory response at light loads, as in FIG. 5A.

In theory, loop stability can be ensured by guaranteeing enough PM at each conversion step, i, in the piecewise linear model. To maintain a fixed integrator asymptote crossing ($f_I$) and ensure stable operation, $f_{CLK}$ should be linearly reduced, from the LSB stable clock rate, $f_{CLK,LSB}/(N-i+1)$, every iteration i. Avoiding significant overshoots and undershoots during the initial SAR conversion steps is a contrary demand because $f_{CLK}$ should be scaled exponentially the other way around in a binary increasing manner, i.e., $2^i\ f_{CLK,LSB}$, such that $f_{CLK,LSB}$ at the first iteration is faster than the MSB slew rate, MSB×$\Delta V_{dropout}/C_{out}$×1/$\Delta V_{ov}$, where $\Delta V_{ov}$ is the allowed overshoot magnitude, or 1/(2$T_R$), for $\Delta V_{ov}=\Delta V_{droop}$. Therefore, a DLDO according to FIG. 1A incorporating binary search is inherently unstable, or otherwise, provides an output with unacceptably large overshoots and undershoots.

In a pragmatic SAR-based LDO of FIG. 2A, a zero is added at $f_L$ to the open-loop transfer function in (3) through an adaptive PD compensation scheme, converting the LDO into a first order system. This compensation, however, is more generally applicable.

Specifically, proportional derivative compensation of the invention is generally applicable to digital LDOs. It can provide a modified FIG. 1A DLDO or a preferred modified FIG. 2A RLDO. The barrel shifter in a linear search DLDO like FIG. 1A should ideally be locked once the output voltage reverses the direction of its slope and starts to increase toward $V_{ref}$ (e.g., after turning on three fingers) to avoid overshoot. In other words, the loop integrator should be incremented (+1 state) only when $V_{out}$ has a negative slope (derivative term) while $V_{out}$ is less than $V_{ref}$ (proportional term). Similarly, the loop integrator should be decremented (−1 state) only when $V_{out}$ is trending upward, i.e., with a positive slope, while $V_{out}$ is larger than $V_{ref}$. Otherwise, the loop integrator value should be kept fixed (0 state). This behavior can be described by the control law of the preferred PD compensator as if($V_{out}[k]<V_{ref}$)&($dV_{out}/dt<0$)increment elseif($V_{out}[k]>V_{ref}$)&($dV_{out}/dt>0$)decrement. (3)

Figure 4C:
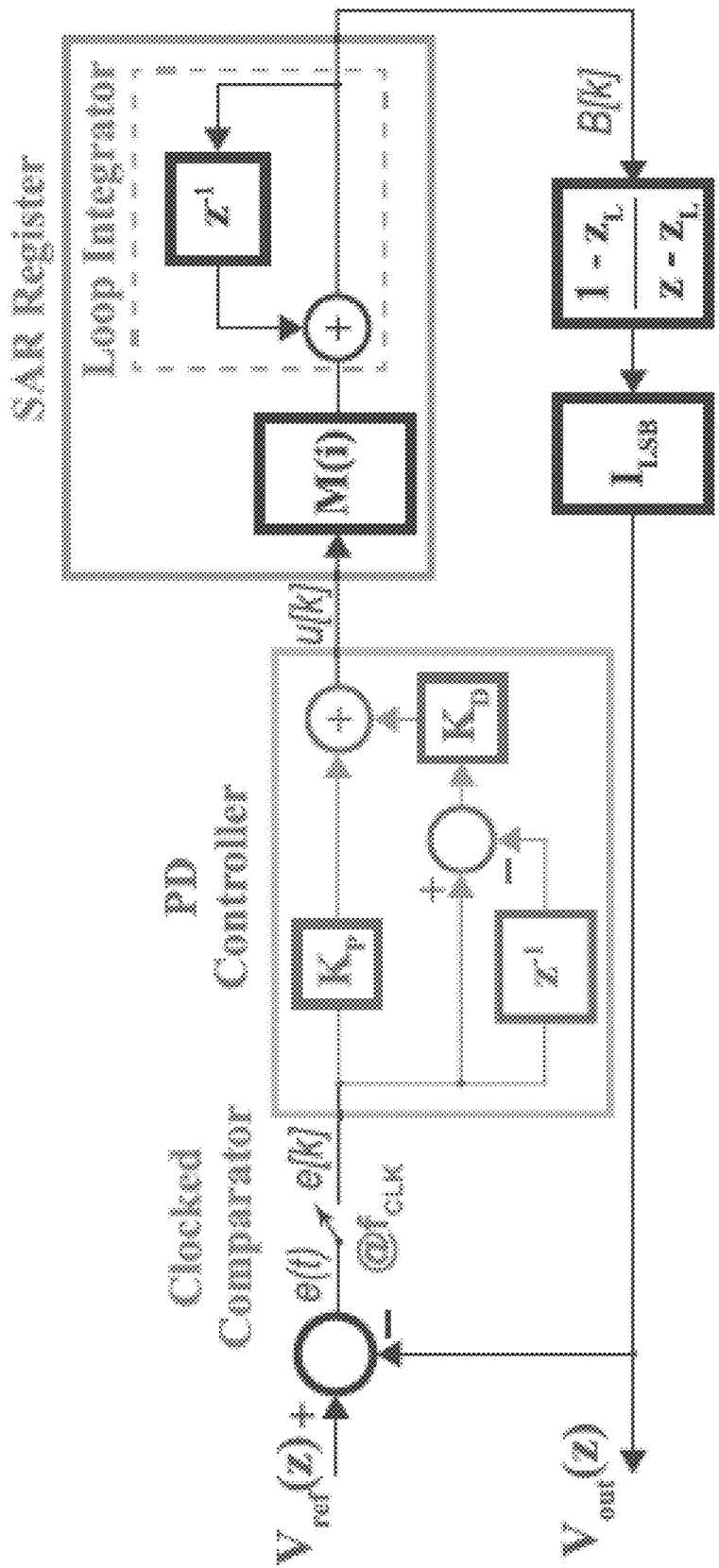

The illustrated proportional term logic in Equation (3) can be implemented through the quantized error voltage, e[k]= ($V_{ref}$-$V_{out}$ [k]), which is +1 when $V_{ref}$>$V_{out}$, and −1 when $V_{out}$>$V_{ref}$. The derivative term logic in Equation (3) can be evaluated through the difference (e[k]−e[k−1]) which is equivalent to $\Delta V_{out}$[k]=($V_{out}$[k−1]−$V_{out}$[k]). Therefore, the PD control law in Equation (3) can be implemented through the addition of the aforementioned two terms as u[k]=$K_p$e[k]+$K_D$ $\Delta V_{out}$ [k], where u[k] is the PD output that is provided to the loop integrator (i.e., barrel shifter or SAR register), $K_p$ and $K_D$ are the proportional and derivative coefficients, and $\Delta V_{out}$[k] is the derivative term. Table I illustrates the PD output across the possible values of the proportional and derivative terms. To illustrate the effect of the preferred PD compensation on the LDO frequency response, PD compensation is incorporated in the small-signal model in FIG. 4C. Using a backward-difference approximation to the differentiation operator, de(t)/dt, the discrete equivalent of a continuous-time PD compensator, $K_p$e(t)+$K_{DC}$ de(t)/dt, can be found as $K_p$e[k]+$K_{DC}$ (e[k]−e[k−1])/$T_{CLK}$. Therefore, the PD compensation inserts a zero at −$K_p$/$K_D\ _C$ (or −$K_p$/$K_D$×$f_{CLK}$) to the corresponding continuous-time open-loop transfer function in Equation (2). Unfortunately, conventional series PD compensators have fixed coefficients ($K_p$ and $K_D$) at run time. Consequently, the added zero cancels the phase lag of the output pole $f_L$=2η$\omega_n$ only when −$K_p$/$K_{DC}$ is more dominant than $f_L$ (high currents), limiting the achievable $I_L$ dynamic range.

TABLE I

PD CONTROL ACTION

| P term | D term | PD output |
|---|---|---|
| $\frac{1}{2}(V_{ref} - V_{out}[k])^*$ | $\frac{1}{2}(V_{out}[k-1] - V_{out}[k])^*$ | u[k] |
| +1/2 | +1/2 | +1 |
| +1/2 | −1/2 | 0 |
| −1/2 | +1/2 | 0 |
| −1/2 | −1/2 | −1 |

On the other hand, each P and D term is individually quantized before the addition, enabling adaptation of the inserted zero with the output pole while ensuring the P and D terms have equal weights in the final output.

This compensation is different than a conventional PD compensator, as can be illustrated when $V_{out}$ is much less than $V_{ref}$, yet is slowly approaching $V_{ref}$. In this case, the conventional PD outputs +1, since the D term, $\Delta V_{out}$ [k], is negative with a magnitude much less than the positive P term, ($V_{ref}$-$V_{out}$ [k]). On the other hand, the PD output provided in the present preferred technique is zero, since the P and D terms are quantized individually before the addition, and hence the P term is +1 while the quantized D term is −1.

To account for the quantization effect, an input, e[k], dependent quantization gain is added to the P and D coefficients such that $K_p=k_p \times k_{Qp}(e[k])$, where $|k_{Qp} \times e[k]|$ is 1, and similarly, $K_D=k_d \times k_{Qd}(e[k])$ where $|k_{Qd} \times \Delta e[k]|$ is 1. Therefore, $k_{Qp}$ is simply $1/|V_{out}[k]|$, where $V_{ref}$ is set to zero under small-signal operation. The D-term difference $e[k]-e[k-1]$ can be evaluated by $(V_{out}[k-1]-V_{out}[k])$ which is equivalent to $(G_p(i)+G_L) v_{out}[k]/C_{out} \times T_{CLK}$ or essentially $f_L/f_{CLK} \times v_{out}[k]$, for sufficiently small values of $T_{CLK}$. Therefore, the D-term quantization gain $k_{Qd}$ becomes $f_{CLK}/(f_L v_{out}[k])$ so that $|k_{Qd} \times \Delta e[k]|$ is 1. Consequently, the resulting zero $-K_R/K_{DC}$ in Equation (2) becomes $-f_L$, which perfectly cancels the output pole and enables a single-pole system with PM of 90°, as shown in FIG. 4B, irrespective of $C_{out}$, $R_L$, M(i), and $f_{CLK}$. FIG. 5B verifies the PD compensation efficacy in realizing stable operation irrespective of $I_L$. In summary, inclusion of the third idle state effectively implements cycle-skipping and adapts the rate at which the integrator updates its value, $f_c=f_{CLK}/m$ for integer m, with the output rate, $f_L$, to maintain the output pole, $e^-f_L/f_c$, inside the unity circle.

In a linear search DLDO like FIG. 1A, limiting cycling modulates the duty cycle of the n oscillating fingers at $f_{CLK}/(2n)$ to maintain the average $V_{out}$ close to $V_{ref}$. Such duty-cycle modulation fails to provide the desired $V_{out}$ level, as the current of cycling ON/OFF LSBs becomes comparable to $I_L$ and hence gives a more pronounced $V_{out}$ steady-state error, especially at large dropout voltages. For example, in the 7-bit barrel-based DLDO of FIG. 1A, the steady-state error exceeds $\pm 1\%$ $V_{ref}$ when $I_L$ is $2^{2.6}$ below $I_{L,max}$ for $V_{ref}=V_{in}/2$, as determined by simulations. Limit-cycle oscillations result in an output voltage ripple, $\Delta V_{out,p-p}$, proportional to the number of limit-cycling fingers, n. As $I_L$ is reduced, the output peak-to-peak ripple increases since the effect of the limit-cycling fingers on $V_{out}$ is more pronounced at lighter loads, as shown in simulations. $\Delta V_{out,p-p}$ can be reduced by increasing the DLDO operating frequency, $f_{CLK}$, and hence the DLDO output ripple frequency $f_{CLK}/(2n)$, beyond the output RC network corner $f_L$. Unfortunately, the higher $f_{CLK}$ results in a lower damping factor $\eta$ and eventually an oscillatory response. For a 7-bit DLDO, when $V_{ref}=0.9 V_{in}$, the load current range with a peak-to-peak ripple below 50 mV is limited to $2^{6.7}$. Therefore, the LDO minimum $I_L$ is typically limited by the acceptable steady-state error level, at large $\Delta V_{dropout}$, and the allowable output voltage ripple, at small $\Delta V_{dropout}$, of the limit-cycling LSB(s), and hence the resolution N, which determines both, defines the achievable dynamic range $I_{L,max}/I_{L,min}$. Increasing the resolution N causes a worse transient FOM.

On the other hand, after the SAR conversion in FIG. 2A, $V_{out}$ becomes within one $I_L \times$LSB of the desired target, $V_{ref}$. Since the RLDO does not exhibit limit-cycle oscillations, the pMOS array conductance $G_p$ converges to $G_{ref} \pm$LSB at steady-state, where $G_{ref}$ is the pMOS conductance that makes $V_{out}$ matches $V_{ref}$ and the final $V_{out}$ value is $V_{in} \times G_p/(G_p+G_L)$. As a result, the worst case error becomes $\sim \pm((LSB)/(G_L (1+G_{ref}/G_L))) \times V_{in}$ or $\pm((LSB)/G_L) \Delta V_{dropout}$. As the load current, $G_L$, is reduced or $\Delta V_{dropout}$ is increased, the worst case steady-state error increases. Therefore, the load dynamic range $I_{L,max}/I_{L,min}$ with certain error-% becomes limited to: error-%$\times 2^N$, e.g., (N–6.6) bits range for a $\pm 1\%$ $V_{ref}$ error. This problem could limit dc accuracy in the FIG. 2A RLDO. To mitigate the accuracy problem as well as enable sub-LSB $I_L$ regulation, a redundant LSB switch 26 (see FIG. 2A) is employed while the duty ratio, D, of its gate voltage is modulated like a lossy switched-mode buck converter. Other forms of modulation of the gate voltage can also be used, for example, Delta sigma can eliminate the output voltage ripple of PWM modulation. Instead of the periodic 10-70 mV ripple encountered during limit cycling in typical prior DLDOs [See, e.g., S. B. Nasir, S. Gangopadhyay, and A. Raychowdhury, "All-digital low-dropout regulator with adaptive control and reduced dynamic stability for digital load circuits," IEEE Trans. Power Electron., vol. 31, no. 12, pp. 8293-8302, December 2016], a dual-bound ($V_{ref,H}$, $V_{ref,L}$) hysteretic PWM controller can be used in preferred embodiments to generate the redundant LSB drive signal.

Figure 6B:
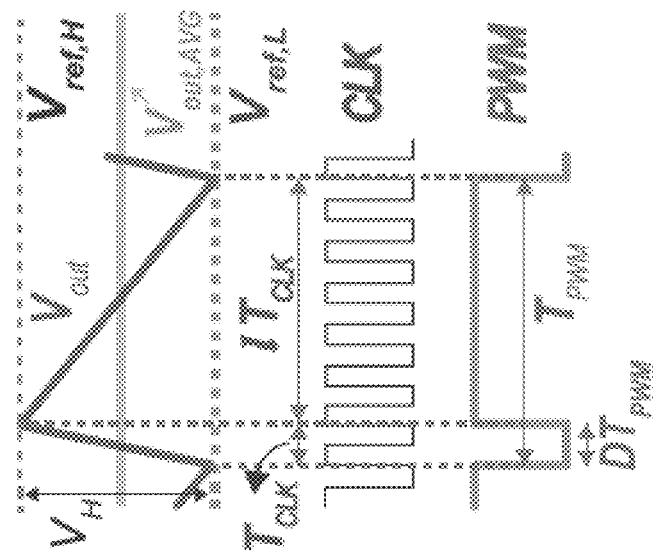
FIG. 6B illustrates the waveforms.
Figure 6A:
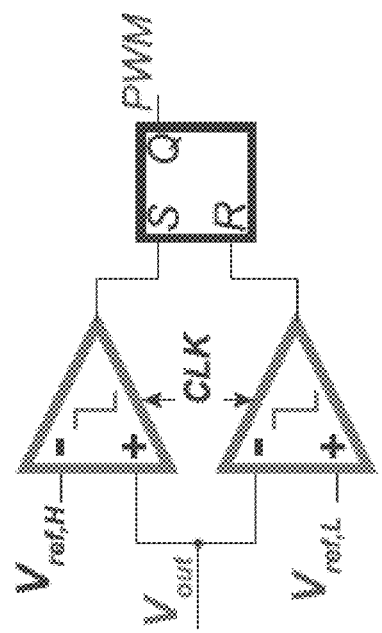
FIG. 6A illustrates a preferred hysteric PWM control applied to a redundant LSB bit in the FIG. 2A RLDO.

FIG. 6A illustrates a preferred hysteric PWM control and FIG. 6B illustrates the waveforms. Once the SAR controller brings $V_{out}$ to within the hysteretic window, the SAR controller is clock-gated and the PWM window, the SAR controller is clock-gated and the PWM control is enabled. Here, the same SAR P-term comparators are reused, to set or reset an SR latch that provides the gate voltage, PWM, of the redundant LSB, as in FIG. 6A-6B.

The average output value of a dual-bound hysteretic PWM control scheme is half of the hysteresis height, $V_H/2$, as in FIG. 6B. Therefore, the steady-state error in a DLDO can be eliminated by setting the hysteresis bounds at $V_{ref,H}=V_{ref}+V_H/2$ and $V_{ref,L}=V_{ref}-V_H/2$, under a high sampling rate. Furthermore, at light loads, the minimum current supplied by the DLDO can go below the LSB finger current by $I_{sub-LSB}=(1/(1+1))I_{LSB}$ [FIG. 6B], with zero steady-state error and without the ripple exceeding $V_H$, unlike limit-cycle oscillation. Therefore, the achievable effective LSB, and thus the dynamic range, is extended by log 2(1+1) bits. The PWM controller also limits the cycling switches to only a single pMOS finger which reduces the steady-state quiescent power.

Figure 7:
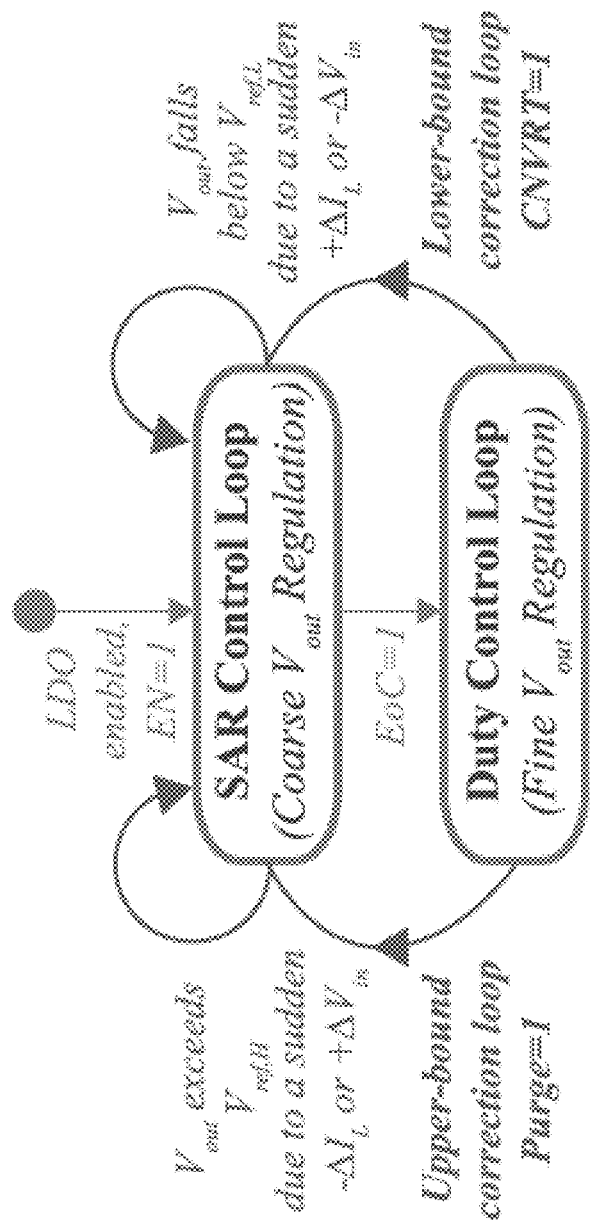
FIG. 7 is a high-level state diagram of a preferred RLDO of the invention in accordance with FIG. 2A.

FIG. 7 shows a high-level state diagram of a preferred RLDO of the invention that incorporates the three techniques discussed above: SAR switching, adaptive PD compensation, and sub-LSB PWM control. As shown in FIG. 7, once the RLDO is enabled (EN=1), the SAR control loop is initiated and the number of turned on pMOS fingers is adjusted to coarsely set $V_{out}$ to $V_{ref}$. Once EoC is asserted, the duty-cycle controller is enabled to perform sub-LSB fine regulation. If, during duty control or SAR conversion steps, a sudden load-current $\Delta I_L$ or input-voltage $\Delta V_{in}$ step occurs that knocks $V_{out}$ outside the control hysteresis, upper- and lower-bound correction logic restarts the SAR operation by asserting CNV.

Figure 8B:
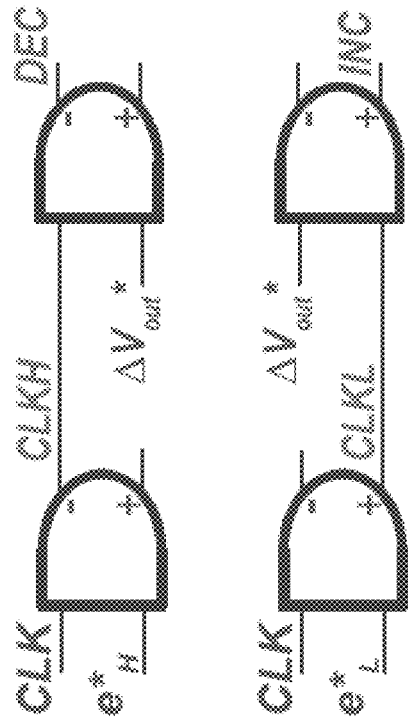
FIG. 8B illustrates a preferred gate-level implementation of a truth table for a preferred PD compensation.
Figure 8A:
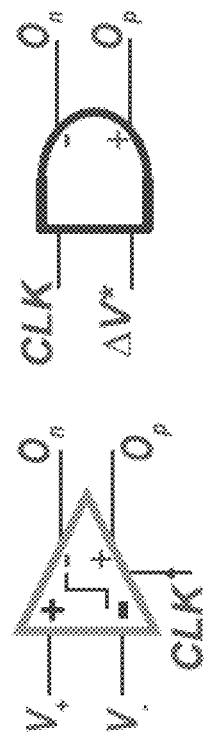
FIG. 8A illustrates a clocked sense amplifier and an equivalent differential quantized AND gate to use in proportional derivative (PD) compensation of the RLDO of FIG. 2A.

The PD compensator output can take on one of three values, either +1, –1, or 0; thus, two variables, INC and DEC, are used to represent the PD output state. Table II illustrates the relationship of these variables, when $K_p$ and $K_D$ are set to ½. The INC and DEC signals are not static signals that take on a fixed value but rather act as pulsed signals, since they are used as clock inputs to the SAR logic in the RLDO. A clocked sense amplifier can be considered as a differential quantized AND gate, as illustrated in FIG. 8A. When the quantized difference $\Delta V^*=[V_+-V_-]^*$ between the input analog signals is 1, the sampling clock propagates through the positive output $O_p$ of the gate and vice versa for the negative output $O_n$. FIG. 8B illustrates the quantized gate-level implementation of the truth table of the PD compensator (which is in Table II below), where $e_x^*[k]$ represents the quantized error $[V_{rep,x}-V_{out}[k]]^*$.

TABLE II

TRUTH TABLE OF PD COMPENSATOR

| | From Block Diagram | | | |
|---|---|---|---|---|
| | Logic Inputs | | Logic Outputs | |
| u[k] | e* | $\Delta V_{out}^*$ | INC | DEC |
| +1 | 1 | 1 | CLK | 0 |
| 0 | 1 | 0 | 0 | 0 |
| 0 | 0 | 1 | 0 | 0 |
| −1 | 0 | 0 | 0 | CLK |

The PD essentially acts as an XNOR gate, where it gives a true (pulsing) output when the number of true inputs is even as shown in Table II.

Figure 9:
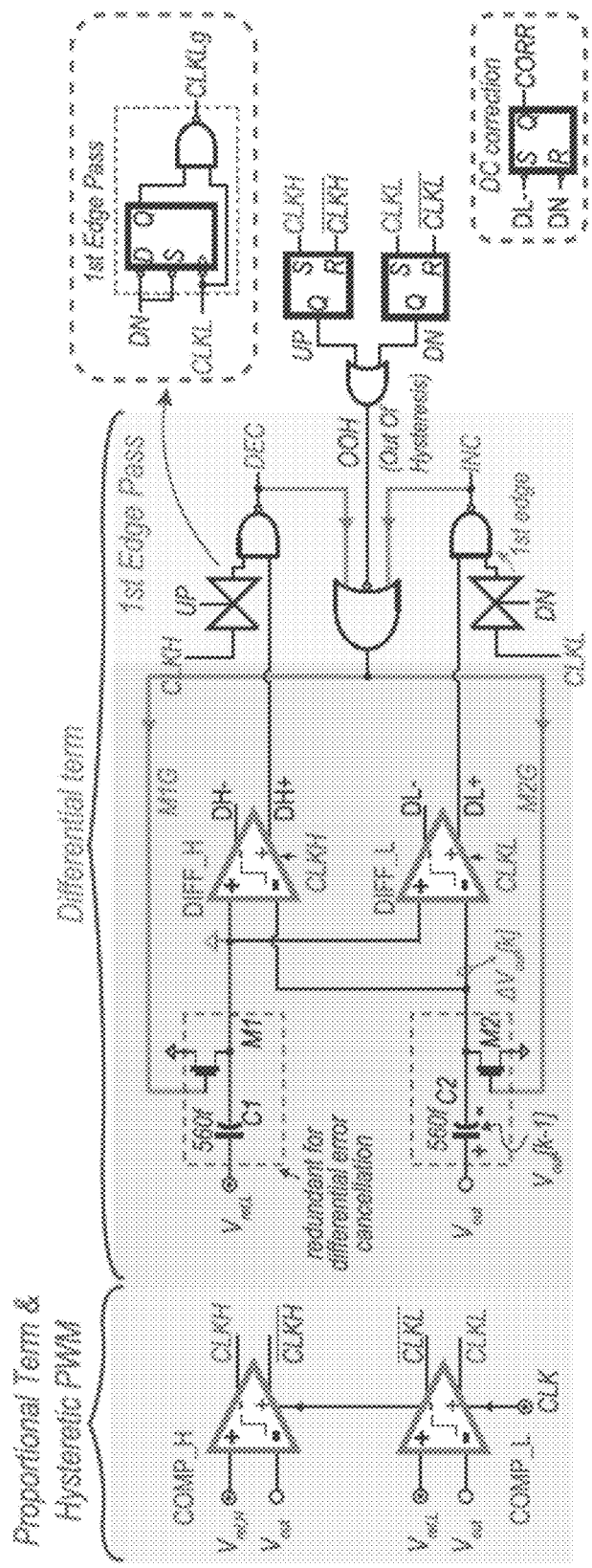
FIG. 9 is a schematic of a preferred PD compensation circuit for the FIG. 2A RLDO.
Figure 10:
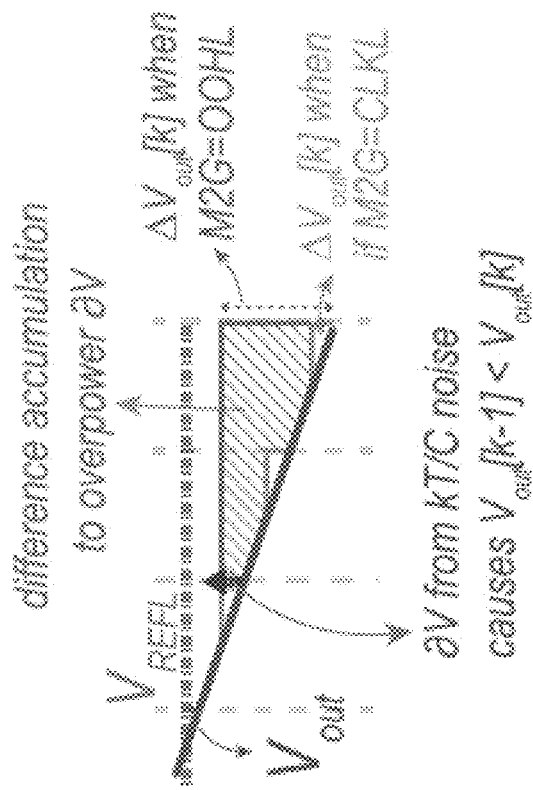
FIG. 10 is an illustration of voltage difference accumulation of the FIG. 9 PD compensator that effectively overpowers erroneous voltage level comparisons that can arise from noise.

FIG. 9 provides a schematic of an implemented PD compensator, with top-level PWM comparators, derivative term comparators, and bottom-plate sampling circuitry. The two PWM comparators, $COMP_H$ and $COMP_L$, implement the proportional term and thus provide the quantized errors $[V_{ref,H}-V_{out}[k]]^*$ and $[V_{ref,L}-V_{out}[k]]^*$, respectively. They establish a hysteresis where all the RLDO circuitry is disabled for minimal $I_Q$ and $V_{out}$ comes to a halt. The comparators $DIFF_H$ and $DIFF_L$ implement the differential term $\Delta V_{out}^*[k]$. The derivative term $(V_{out}[k-1]-V_{out}[k])$ of the PD compensator is implemented through the bottom-plate sampling circuit that includes a footer nMOS switch and a 560-fF sampling capacitor C2. When the sampling clock M2G is high, the value of $V_{out}$ is stored across the sampling capacitor. When M2G is low, the voltage of the negative comparator terminal becomes the difference term $(V_{out}[k]-V_{out}[k-1])$. The difference is then compared to a virtual ground through the comparators $DIFF_H$ and $DIFF_L$ to produce the quantized difference term $[V_{out}[k-1]-V_{out}[k]]^*$. A replica sample and hold circuit (capacitors C1 and C2 and NMOS switches N1 & N2) is employed to sample $V_{ref,L}$, ($\approx V_{out}$) in order to establish a virtual ground at the positive terminal of the comparators, so that errors due to charge-injection, clock feed-through, or comparator kickback noise are canceled via the inherent symmetry. The sampling switches M1 and M2 are enabled from INC and DEC instead of CLKL and CLKH so that the difference $\Delta V_{out}$ accumulates and becomes $(V_{out}[k]-V_{out}[k-m])$. Therefore, if an erroneous $DIFF_H$ or $DIFF_L$ comparison results due to kT/C noise, the difference increases until it overpowers this error. The operation of difference accumulation to overpower this effort is illustrated in FIG. 10.

When $V_{out}$ is within hysteresis, OOH is reset low through the two SR latches in FIG. 9. Thus, the footer nMOS sampling switches are statically enabled through the OR 1 gate that propagates the complement of OOH to the sampling switch gate in FIG. 9. Once $V_{out}$ is outside hysteresis, the rising edge of the first clock pulse CLKL or CLKH might trigger the comparators $DIFF_L$ and $DIFF_H$ when the difference $(V_{out}[k]-V_{out}[k-1])$ is small, and hence the comparison result becomes stochastic. As a result, a clock pulse might be lost, which would increase the RLDO response time. To prevent this, the first edge pass logic in FIG. 9 allows the first clock pulse CLKL (CLKH) to pass directly to INC (DEC) irrespective of the $DIFF_L$ ($DIFF_H$) comparison result.

During duty control, the redundant LSB current can fail to bring the output voltage above $V_{ref,L}$ if a large load-current increase $+\Delta I_L$ or a large input-voltage decrease $-\Delta V_{in}$ occurs. Therefore, lower-bound trigger logic is employed to restart the SAR search with the MSB, B(6), on and the remaining pMOS transistors off, by asserting $CNV_D$, created by AND-ing the redundant LSB gate signal, PWM, and INC (INC pulse is produced by passing CLKL through first edge pass logic in FIG. 9, during PWM control). In the worst case, the lower-bound trigger logic takes two clock cycles to turn on the MSB switch, and hence the clock frequency is set by the required response time as: $f_{CLK} > 2/T_R$.

Figures 11A, 11B:
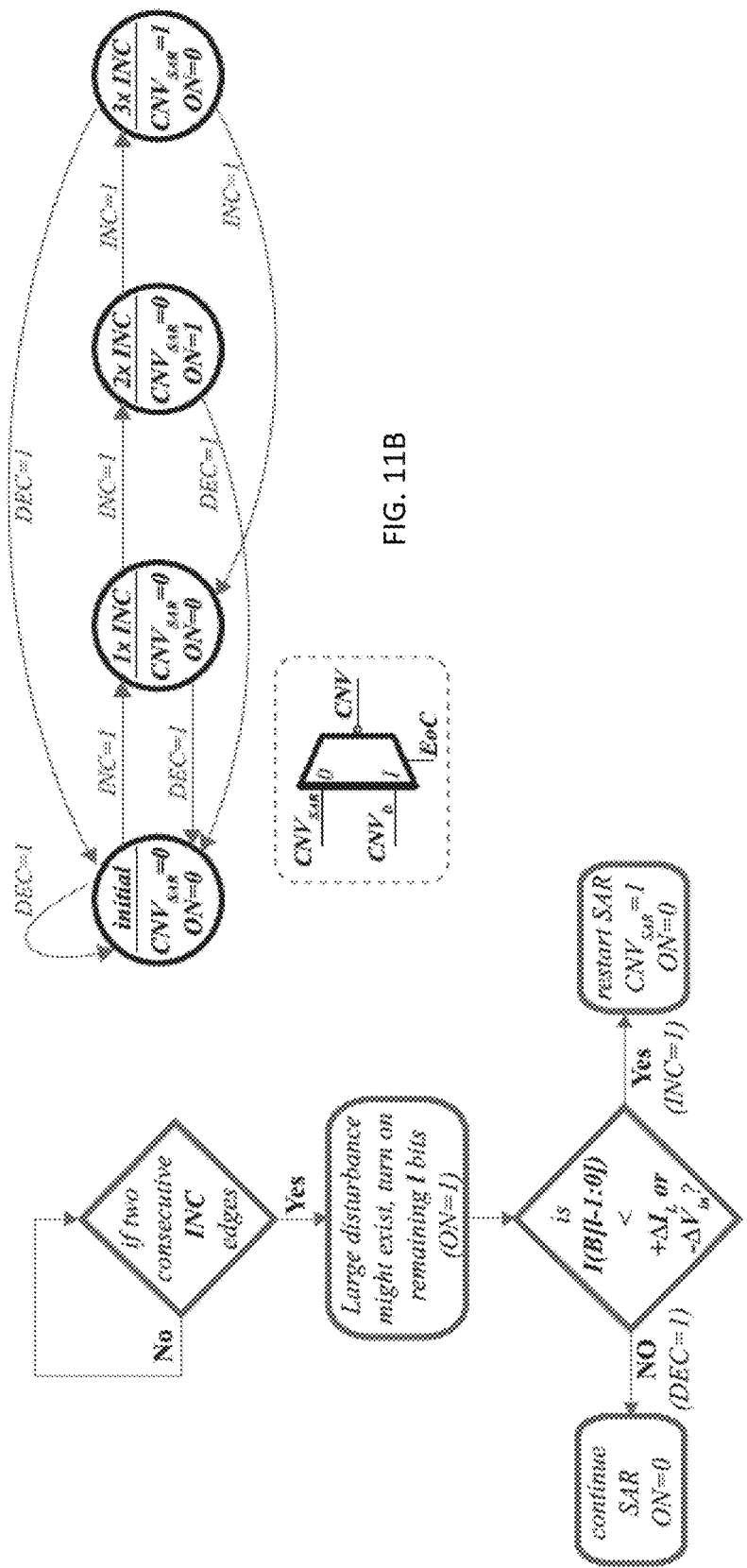
FIGS. 11A and 11B are respectively a flow chart and state diagram of a branch prediction method that is preferred to avoid artificial undershoots in the FIG. 2A RLDO.

FIGS. 11A and 11B are respectively a flow chart and state diagram of a branch prediction method that is preferred to avoid artificial undershoots that may be introduced if a large $+I_L$ or $-V_{in}$ step change occurs in the middle of the SAR conversion steps after deciding the first few MSBs. In FIG. 11A, when two consecutive INC edges result without any DEC assertion in-between during the SAR bit-cycling, the branch-prediction logic predicts that there is a disturbance, $+\Delta I_L$ or $-\Delta V_{in}$, that is large in amplitude, and therefore, the remaining unchecked 1 bits in the switch array may not be able to compensate for this disturbance. To verify this, the branch-prediction logic temporarily enables the remaining unchecked 1 bits in the SAR register. If $V_{out}$ exceeds $V_{ref,H}$ (i.e., DEC=1), then the present disturbance, $+\Delta I_L$ or $-\Delta V_{in}$, can be successfully accounted for through the remaining 1 bits and the SAR operation can be continued as normal. This is similar in nature to a branch-not-taken in pipeline hazards terminology. Otherwise, if $V_{out}$ is still slewing downward below $V_{ref,L}$ despite the 1 bits being turned on, then the SAR search should be restarted. This is similar in nature to a branch-taken in pipeline design. Here, a third INC edge results although the 1 bits are turned on, and hence the branch-prediction logic restarts the SAR search operation at $B[k]=7'b0111111$ [B(6) is on] by asserting $CNV_{SAR}$.

Branch prediction can be implemented using a 3-bit sequence detector, shown in FIG. 11B. The Moore state-machine asserts its outputs, ON=1 and $CNV_{SAR}=1$, when it recognizes two and three INC edges in succession, respectively. The state machine resets to its initial state when a DEC edge results. As shown in the inset in FIG. 11B, a 2-input multiplexer is used to select the complement of either $CNV_D$ or $CNV_{SAR}$ as the SAR controller restart signal, CNV, based on the present active control loop, as determined by EoC.

During duty control, a large disturbance can make the output voltage exceed $V_{ref,H}$, even though the redundant LSB is turned off. Similarly, in the middle of the N-step SAR conversion, a sudden $-\Delta I_L$ or $+V_{in}$ can result in increasing $V_{out}$ above $V_{ref,H}$, (i.e., overshoot), despite the turn off of the last determined bit during SAR bit-cycling. This indicates that the already determined bits hold the wrong value due to the unaccounted $-\Delta I_L$ or $+\Delta V_{in}$ disturbance. Such interruptions during SAR control (or PWM) can be corrected by disabling all the switch-array pMOS fingers immediately instead of wasting time investigating the remaining bits and increasing the $V_{out}$ overshoot.

Figure 12:
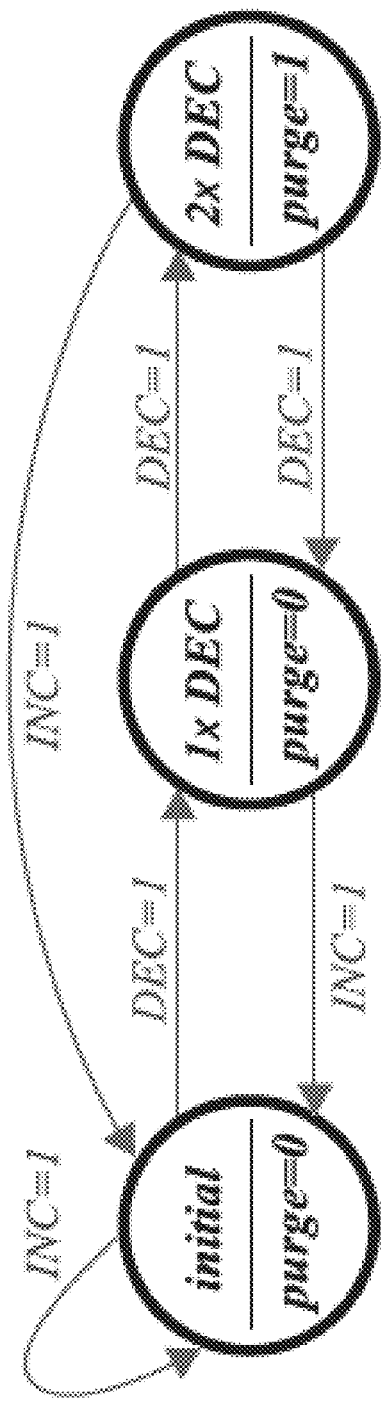
FIG. 12 illustrates a state diagram for an upper bound to avoid artificial overshoots in the FIG. 2A RLDO.

FIG. 12 illustrates a state diagram for the upper bound, including trigger logic that is implemented through a 2-bit sequence detector. The sequence detector asserts its output, purge, when two DEC edges occur in succession. On the other hand, the Moore machine resets to its initial state when an INC edge occurs. After turning off the whole pMOS switch array through the activated purge, the lower-bound logic restarts the SAR search operation when the output voltage, $V_{out}$, falls below $V_{ref,L}$ due to any $+\Delta I_L$ or $\Delta V_{in}$ disturbance.

PD compensation has a disadvantage in that it can reduce the steady-state dc accuracy. During binary search, the pMOS DAC array is sequentially turned on, starting from the MSB, until $V_{out}$ reverses the direction of its slope and starts to increase toward the hysteresis window after turning on B(i). Since the pMOS array current depends on the dropout voltage, as $V_{out}$ increases, the current of the pMOS array, including the last turned on finger B(i), decreases and $V_{out}$ can get stuck below $V_{ref,L}$ without reaching the hysteresis window. To avoid such an occurrence, the next MSB switch B(i−1) is turned on, as an extra safety step, although the present bit, B(i), is enough to charge $V_{out}$ toward the hysteresis.

When $V_{out}$ is less than $V_{ref,L}$ and is increasing, the sampling clock propagates to the negative output of $DIFF_L$, DL−, in FIG. 9, which is employed to set a dc correction flag CORR. As a result, the next MSB in the switch array, B(i−1), is temporarily turned on to provide an extra half-B(i) conductance in parallel to the present investigated bit, B(i), to ensure the rapid increase of $V_{out}$ toward $V_{ref,L}$ and hence avoid any possible condition of $V_{out}$ being stuck below $V_{ref,L}$. Once $V_{out}$ exceeds $V_{ref,L}$, DN in FIG. 9 is reset low, which clears the dc correction flag CORR, and hence, the temporarily turned on bit is turned back off A similar architecture can follow to avoid the case of $V_{out}$ being stuck above $V_{ref,H}$.

FIG. 13 provides pseudo SAR logic for the SAR controller 14 in FIG. 2A. The SAR logic follows a perturb and observe algorithm to determine the value of each bit in the pMOS switch array 12. In the perturb phase, one bit in the switch array is turned on in order to test its output current value in comparison to the load current $I_L$. In the observe phase, the comparison result of the output voltage $V_{out}$ with the desired target $V_{ref}$ determines the value of the binary bit being tested through DEC and INC, coming from the PD controller to avoid oscillatory response as discussed. If $V_{out}$ exceeds $V_{ref}$ due to the present bit output current, DEC is set high, and the present bit under test is turned off Otherwise, if $V_{out}$ falls below $V_{ref}$, INC transitions from 0 to 1, and the present bit being tested is left on and the conversion process proceeds to the next MSB until all the bits in the switch array have been determined.

The fabricated RLDO of the present invention consistent with FIG. 2A was compared to prior works. The data is shown in FIG. 14. The preferred fabricated RLDO (with PD compensation) was verified to provide an exponential improvement of $½^N$ compared to linear-search DLDOs. A peak current efficiency of 99.8% for 0.5 to 0.3V conversion was achieved. The RLDO also achieved a current efficiency greater than 90% from 33.6 µA to 2 mA. The fabricated RLDO achieved a 60× load current dynamic range, which far exceeds prior art examples of 1.6×, 3.3× and 10×. Current efficiency greater than 84.4% was achieved across a 50× dynamic range at 0.5 to 0.45 V, exceeding a simulated barrel-based DLDO by 46.4%. The prior art compared in the table of FIG. 14 is taken from the following list, and the table includes numbers. The present RLDO can achieve a much smaller active area because the SAR control uses a small number of D flip flops, and the controller implementation is simple compared to prior state-of-the art designs.

REFERENCES FOR FIG. 14

[1] Y. Okuma et al., "0.5-V input digital LDO with 98.7% current efficiency and 2.7-µA quiescent current in 65 nm CMOS," CICC., 2010.

[2] Y. Lu et al., "A 0.65 ns-Response-Time 3.01 ps FOM Fully-Integrated Low-Dropout Regulator with Full-Spectrum Power-Supply-Rejection for Wideband Communication Systems," ISSCC Dig. Tech. Papers, 2014.

[3] D. Kim et al., "Fully Integrated Low-Drop-Out Regulator Based on Event-Driven PI Control," ISSCC Dig. Tech. Papers, 2016.

[4] S. B. Nasir et al., "A 0.13 µm Fully Digital Low-Dropout Regulator with Adaptive Control and Reduced Dynamic Stability for Ultra-Wide Dynamic Range," ISSCC Dig. Tech. Papers, 2015.

[5] Y. Lee et al., "A 200 mA Digital Low-Drop-Out Regulator with Coarse-Fine Dual Loop in Mobile Application Processors," ISSCC Dig. Tech. Papers, 2016.

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

The invention claimed is:

1. A low power voltage regulator, comprising:
a weighted transistor array having a plurality of transistor switches with a total conductance of G, the switches corresponding to bits ranging from a most significant bit (MSB) to a least significant bit (LSB), a transistor switch corresponding to the MSB having a conductance of G/2 and remaining bits having a consecutive descending conductance of $G/2^N$ to the LSB, and further including a redundant LSB transistor switch having the same $G/2^N$ conductance of the LSB;
a search controller that conducts a binary search by turning on respective ones of the plurality of transistor switches beginning with the MSB to find a total conductance value of said weighed transistor array that realizes the nearest output voltage to a desired target output voltage;
a LSB controller to enable the redundant LSB transistor in response to steady-state errors;
an overshoot controller that interrupts the search controller in response to voltage or current step changes that are large enough to cause predetermined amounts of overshoot or undershoot; and
a proportional derivative controller to compensate an output voltage from the weighted transistor array.

2. The regulator of claim 1, wherein the search controller conducts a recursive successive approximation by turning on bits from the MSB to the LSB for coarse control within a coarse range of the target voltage and then the overshoot controller conducts fine control after the coarse control determines a predetermined number of MSB bits to turn on to achieve the coarse range.

3. The regulator of claim 2, wherein the overshoot controller comprises a hysteretic dual-bound bang-bang controller.

4. The regulator of claim 3, wherein the hysteretic dual-bound bang-bang controller resets the search controller to conduct coarse control if the output voltage falls out of a regulation boundary.

5. The regulator of claim 3, wherein the hysteretic dual-bound bang-bang controller controls the binary search to a fraction of the LSB.

6. The regulator of claim 1, wherein the proportional derivative controller cancels an output pole to provide a single pole voltage output.

7. The regulator of claim 6, wherein the proportional derivative controller comprises two pulse width modulation comparators that implement a proportional term, a comparator to implement a differential term, and a replica path to reject charge injection and kickback.

8. A method for proportional derivative digital compensation of a voltage regulator, the method comprising generating an output voltage in a voltage regulator targeting a target voltage and eliminating an output pole of the voltage regulator to provide a stable voltage regulator operation irrespective of load current, load capacitance, or sampling frequency.

9. The method of claim 8, wherein the eliminating the output pole avoids oscillatory behavior in response to the slope of the output achieving a correct polarity by discontinuing output approximation and allowing the compensation to stabilize the output voltage.

10. A method for duty cycle regulation of a digital voltage regulator, the method comprising generating an output voltage in a voltage regulator targeting a target voltage with a plurality of bits from a most significant bit to a least significant bit, and adding additional effective number of to increase a resolution limit of the digital voltage regulator by regulating voltage below the least significant bit of the digital voltage regulator through pulse-width-modulation of an additional LSB (least significant bit) switch.

\* \* \* \* \*

UNITED STATES PATENT AND TRADEMARK OFFICE
CERTIFICATE OF CORRECTION

PATENT NO. : 10,224,944 B2
APPLICATION NO. : 15/888661
DATED : March 5, 2019
INVENTOR(S) : Loai Galal Bahgat Salem and Patrick Mercier Page 1 of 1

It is certified that error appears in the above-identified patent and that said Letters Patent is hereby corrected as shown below:

In the Specification

In Column 1, Lines 15-18, please amend the STATEMENT OF GOVERNMENT INTEREST to read: This invention was made with government support under grant no. HR0011-16-C-0037 awarded by the Defense Advanced Research Projects Agency. The government has certain rights in the invention.

Signed and Sealed this
Second Day of November, 2021

Drew Hirshfeld
*Performing the Functions and Duties of the*
*Under Secretary of Commerce for Intellectual Property and*
*Director of the United States Patent and Trademark Office*